(12) United States Patent
Yang et al.

(10) Patent No.: US 8,451,431 B2
(45) Date of Patent: May 28, 2013

(54) CONTROL SYSTEMS AND METHODS APPLYING ITERATIVE FEEDBACK TUNING FOR FEED-FORWARD AND SYNCHRONIZATION CONTROL OF MICROLITHOGRAPHY STAGES AND THE LIKE

(75) Inventors: Pai-Hsueh Yang, Palo Alto, CA (US); Shiang-Lung Koo, Fremont, CA (US)

(73) Assignee: Nikon Corporation, Tokyo (JP)

( * ) Notice: Subject to any disclaimer, the term of this patent is extended or adjusted under 35 U.S.C. 154(b) by 521 days.

(21) Appl. No.: 12/657,805

(22) Filed: Jan. 27, 2010

(65) Prior Publication Data
US 2010/0188647 A1    Jul. 29, 2010

Related U.S. Application Data

(60) Provisional application No. 61/147,719, filed on Jan. 27, 2009.

(51) Int. Cl.
*G03B 27/58* (2006.01)
*G03B 27/62* (2006.01)

(52) U.S. Cl.
USPC .............................................. 355/72; 355/75

(58) Field of Classification Search
USPC ......... 355/53, 72–76; 310/10, 12; 318/368.22
See application file for complete search history.

(56) References Cited

U.S. PATENT DOCUMENTS

| | | | |
|---|---|---|---|
| 5,528,100 A | 6/1996 | Igeta et al. | |
| 5,528,118 A | 6/1996 | Lee | |
| 5,623,853 A | 4/1997 | Novak et al. | |
| 5,668,672 A | 9/1997 | Oomura | |
| 5,689,377 A | 11/1997 | Takahashi | |
| 5,835,275 A | 11/1998 | Takahashi et al. | |
| 5,874,820 A | 2/1999 | Lee | |
| 6,486,941 B1 | 11/2002 | Hazelton et al. | |
| 7,158,840 B2 * | 1/2007 | Jacques | 700/28 |
| 2002/0099475 A1 * | 7/2002 | Spangler et al. | 700/280 |
| 2004/0128918 A1 | 7/2004 | Yang et al. | |
| 2005/0231706 A1 | 10/2005 | Yang et al. | |

OTHER PUBLICATIONS

Hjalmarsson, et al., "Iterative Feedback Tuning—An Overview," *Int. J. Adaptive Control and Signal Processing* 16:373-395 (2002).
Mamun, et al., "Iterative Feedback Tuning (IFT) of Head Positioning Servomechanism in Hard Disk Drive," *Int. J. on Smart Sensing and Intelligent Systems*, Inaugural Issue 1:269-284 (2008).
Wahlberg, "On Iterative Feedback Tuning and Disturbance Rejection Using Simple Noise Models," *IFAC* 6 pages (2005).
Related U.S. Appl. No. 60/424,506 for "Control System and Method for Improving Tracking Accuracy of a Stage Through Processing of Information From Repetitive Motion," filed Nov. 6, 2002, now expired.

* cited by examiner

*Primary Examiner* — Hung Henry Nguyen
(74) *Attorney, Agent, or Firm* — Klarquist Sparkman, LLP

(57) ABSTRACT

Stage assemblies and control methods are disclosed. An exemplary assembly includes a first stage and first and second controllers. The first controller feedback-controls the first stage according to a respective parameter vector. The second controller controls the first stage by feed-forward control, according to a respective parameter vector. The controllers perform iterative feedback tuning IFT, including minimization of a cost-function of the parameter vectors from the first and second controllers. The second controller receives data including first-stage trajectory, and the first controller receives data including first-stage following-error. A suitable application of the assembly is in a microlithography system or other high-precision system.

21 Claims, 27 Drawing Sheets

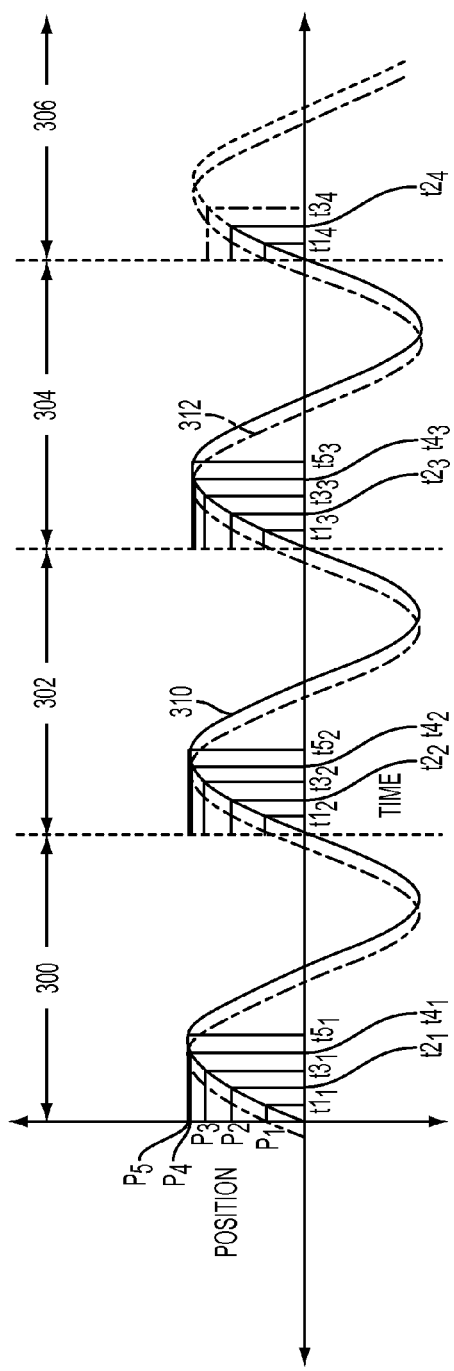
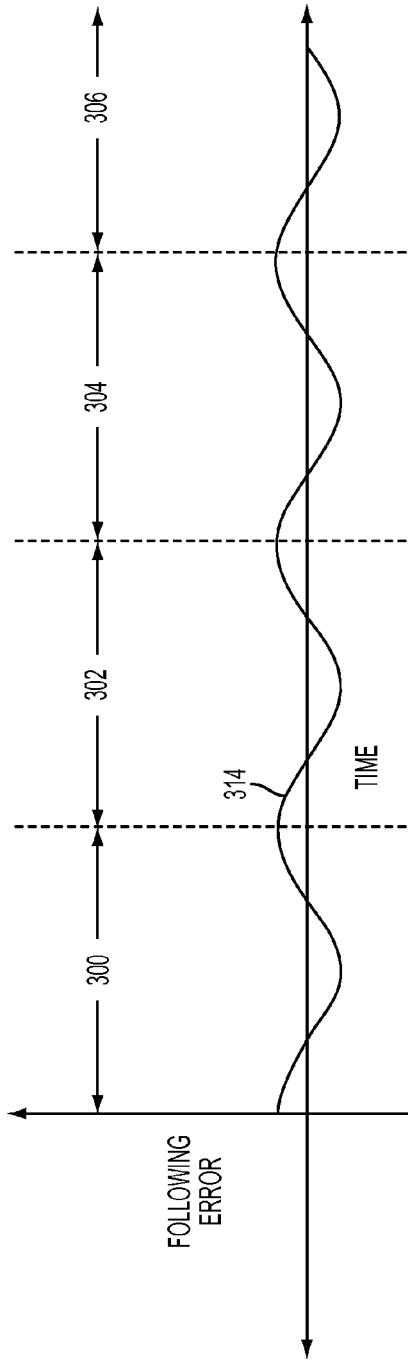
FIG. 3(A)
FIG. 3(B)

CONTROL SYSTEMS AND METHODS APPLYING ITERATIVE FEEDBACK TUNING FOR FEED-FORWARD AND SYNCHRONIZATION CONTROL OF MICROLITHOGRAPHY STAGES AND THE LIKE

CROSS-REFERENCE TO RELATED APPLICATIONS

This application claims priority to and the benefit of U.S. Provisional Patent Application No. 61/147,719, filed on Jan. 27, 2009, which is incorporated herein by reference in its entirety.

FIELD

This disclosure pertains to, inter alia, control systems having particular utility in governing the motions and positions achieved by positioning devices such as, but not limited to, respective stages for holding and moving reticles and substrates in microlithography systems.

BACKGROUND

Many precise industrial processes require machinery in which workpieces, process tools, measurement tools, and the like are accurately positioned and moved, usually while embodying a high degree of automation. An example category of such machinery includes various microlithography systems widely used in the semiconductor-device and microelectronics industries for transferring images from a pattern-defining reticle onto a semiconductor wafer or other suitable substrate during semiconductor processing. In modern microlithography tools, the need to achieve extraordinarily accurate positioning and movements is critical, requiring these tools to achieve position and motion accuracies of their stages in the nanometer range.

A typical microlithographic exposure apparatus includes an illumination source, a reticle-stage assembly that retains a reticle (or pattern master), an optical assembly, a wafer-stage assembly that retains the substrate, a measurement system, and a control system. The wafer-stage assembly includes a wafer stage that retains the lithographic substrate (such as a semiconductor wafer), and a respective mover assembly that precisely positions the wafer stage and the wafer. Somewhat similarly, the reticle-stage assembly includes a reticle stage that retains the reticle, and a respective mover assembly that positions the reticle stage and the reticle. The control system independently directs current to these mover assemblies to generate forces causing motion of the wafer stage and reticle stage along respective "trajectories."

The sizes of the images and features within the images transferred onto the substrate (termed generally a "wafer" herein) from the reticle are extremely small. Accordingly, precise positioning of the wafer and the reticle relative to the optical assembly is critical to the manufacture of high-density semiconductor devices. Typically, multiple identical microcircuits are formed on each wafer. Hence, during manufacture of the microcircuits, the wafer stage and/or the reticle stage are cyclically and repetitiously moved to follow an intended trajectory.

During movements of the stages, respective "following-errors" of the wafer stage and/or the reticle stage can occur. A following-error is the difference between the intended trajectory of the stage and an actual trajectory of the stage at a specified time. A following-error can arise due to lack of complete rigidity in the components of the microlithography tool, which is manifest as a slight time delay between the instant in which current is directed to the mover assembly and the instant in which the stage exhibits the corresponding motion.

Alignment errors can occur even if the stages are properly positioned relative to each other. For example, periodic vibration disturbances of various mechanical structures of the microlithography tool can occur. Examples include oscillations and/or resonances of the optical assembly or supporting structures. These oscillations and/or resonances can significantly degrade relative alignment between the stages and the optical assembly. As a result of following-errors and/or the vibration disturbances, the achievable precision with which micro-devices can be manufactured is compromised.

Conventional approaches to reducing following-errors include feedback control of stage motion. In a stage system under feedback control, during movement of one of the stages a measurement system periodically provides data on the current position of the stage. This data is utilized by a controller to adjust the level of current to the mover assembly of the stage in an attempt to achieve the intended trajectory of the stage. Unfortunately, feedback control is not entirely satisfactory, and the control system does not always precisely move the stage along its intended trajectory.

Also, the movable portion of a stage inherently has mass, usually substantial mass. Regardless of applicable tolerances, controlling positions and motions of a stage involves dealing not only with disturbances originating outside the stage but also with disturbances originating in motions (including accelerations and decelerations) of the stage mass itself. No control system is perfect; each has limitations such as following-error and/or synchrony of relative stage motions. The goal of control systems used with these stages is to achieve a level of stage position and motion control sufficient to meet extremely demanding specifications. As specifications progressively tighten, the need for more accurate and precise control follows apace.

In light of the above, there is a need for control systems and methods that improve the accuracy and precision of stage positioning and movement.

SUMMARY

The need articulated above is satisfied by apparatus and methods as disclosed herein. The apparatus and methods are particularly useful for and/or during automatic calibrations or automatic tunings of a high-precision system, particularly of one or more stages in a high-precision system. A "stage" is an assembly used for holding and moving a thing (e.g., a pattern-defining reticle, a mask, a tool, a workpiece, etc.) with high accuracy and precision. The stage is capable of moving the thing in at least one degree of freedom of motion, usually more than one degree of freedom. The calibration and tuning can be directed to a single stage or of multiple stages, including synchronization of the stages' movements relative to each other. The calibration and tuning are advantageous not only for immediate use of the high-precision system but also for correcting changes in system performance over time. Thus, auto-calibration and/or auto-tuning is one way in which to ensure the system works at optimum performance over time. The calibration and/or tuning can be performed during initial set-up of the system and periodically thereafter.

The subject methods and apparatus achieve control of stages and the like faster than conventionally. More specifically, the subject methods, being iterative, achieve faster control convergence than conventional methods.

According to a first aspect of the subject apparatus and methods, a stage assembly is provided. An embodiment of such a stage assembly comprises a first stage and first and second controllers (or first and second portions of a single controller). The first controller is coupled to control the first stage in a feedback-control manner, according to at least one respective parameter vector. The second controller is coupled to control the first stage in a feed-forward-control manner, according to at least one respective parameter vector. The first and second controllers are programmed to perform iterative feedback tuning (IFT), including minimization of a cost-function that is a function of at least one respective parameter vector from each of the first and second controllers. The second controller can be coupled to receive data including trajectory of the first stage, and the first controller can be coupled to receive data including following-error of the first stage. A particularly suitable application of this stage assembly is a reticle stage or a wafer stage, as used in a microlithography system. Alternatively, the stage assembly can be used wherever a finely controlled stage is needed or useful, such as (but not limited to) various high-precision measuring, positioning, and processing tools.

IFT is an iterative method that obtains control measurement data from "experiments" rather than relying upon lengthy numerical calculations. IFT is also gradient-based, wherein gradients of control parameters are iteratively measured with the aim of minimizing a cost function. Hence, IFT achieves faster and more accurate convergence, and hence more accurate control, than conventional control methods. For example, one gradient experiment can apply to substantially all parameters being controlled by the particular controller.

The stage assembly can further comprise a second stage and a third controller (or third portion of a controller). If the first stage is a reticle stage, the second stage can be a substrate stage, for example, of a microlithography system. Alternatively, the first stage can hold a tool and the second stage can hold a workpiece. The third controller is coupled to receive data regarding at least respective position errors of the first and second stages and is programmed to synchronize movement of the first and second stages, according to at least one respective parameter vector. The third controller can be further programmed to perform IFT, cooperatively with the first and second controllers, including minimization of a cost-function that is also a function of the at least one respective parameter vector of the third controller. The cost-function can include a synchronization error pertaining to the motion of at least one of the first and second stages relative to the other and a control output of the first controller. This control output desirably is a function of the at least one respective parameter vector of each of the first, second, and third controllers. In this three-controller embodiment, the synchronization error can be a function of the at least one respective parameter vector from each of the first, second, and third controllers. The synchronization error and the control output desirably each have respective weighting functions in the cost-function.

Three-controller embodiments can have one or more of several control connections. In a first example, the output of the third controller can be input to the first controller. In a second example, the output of the second controller is summed with an output of the first controller. In a third example, the output of the third controller is connected such that a difference of a trajectory of the first stage and the output of the third controller is input to the first controller. In the third example the input to the first controller is a following-error that is a function of the at least one respective parameter vector of each of the first, second, and third controllers.

Each iteration of IFT performed by one or more of the controllers includes a first experiment directed to an evaluation of a cost-function. The IFT iteration also includes respective experiments directed to measurements of gradients of the at least one respective parameter vector of each of the first, second, and third controllers.

An IFT cost-function desirably includes the following-error of the first stage and a control output of the first controller. The control output is a function of the at least one respective parameter vector of each of the first and second controllers. The following-error and the control output can have respective weighting functions in the cost-function.

According to another aspect, methods are provided for controlling movement of at least a first stage. One embodiment of the methods comprises coupling a first controller (or first portion of a controller) to the first stage in a feedback-control manner to provide a control command to the first stage and to receive data regarding a following-error of the first stage. Outputs (called "first outputs") are produced by the first controller; a first output is a function of at least one respective parameter vector of the first controller. A second controller is coupled to the first controller to control the first stage in a feed-forward manner in cooperation with the first controller. Outputs (called "second outputs") are produced by the second controller; a second output is a function of at least one respective parameter vector of the second controller. Using the first and second controllers, multiple iterations of IFT are performed to minimize a cost-function that is a function of the at least one respective parameter vectors for each of the first and second controllers, thereby IFT-tuning the first and second outputs.

The method can further comprise inputting the second controller with data regarding the trajectory of the first stage. The method can further comprise combining the IFT-tuned first and second outputs to produce a force command, and routing the force-command to the first stage. The results of the multiple IFT iterations can be applied to tune the feedback and feed-forward control of the first stage, as reflected in the force-command routed to the first stage from the first and second controllers. Alternatively, the results of iterations of the IFT can be applied to tune the feedback and feed-forward control of the first stage.

Each iteration of IFT in this embodiment desirably includes evaluating the cost-function and measuring a gradient of the at least one parameter vector of the first controller and a gradient of the at least one parameter vector of the second controller. Based on the evaluation of the cost-function and the measurements of the gradients, the cost-function is minimized. The outputs of the first and second controllers can be tuned based on the minimized cost-function.

The method can further comprise coupling a third controller to the first controller and the first stage, and inputting the third controller with data concerning position errors of the first stage and position errors of a second stage to which motions of the first stage are to be synchronized. The third controller is used, in cooperation with the first and second controllers and according to at least one respective parameter vector of the third controller, for controlling synchronization of the first and second stages. IFT can also be performed with the third controller, in cooperation with the first and second controllers, including minimization of a cost-function that is also a function of the at least one parameter vector of the third controller. With IFT being also performed by the third controller, each iteration of IFT can further include measuring a gradient of the at least one parameter vector of the third controller. Based on the evaluation of the cost-function and the measurements of the gradients, control is achieved by minimizing the cost-function, and tuning the outputs of the first, second, and third controllers based on the minimized cost-function.

According to another aspect of the disclosure, precision systems are disclosed. An embodiment of such a system comprises a process assembly, a first stage, and a first controller (or first portion of a controller). The first stage is movable relative to the process assembly, and the first controller is coupled to control the first stage in a feedback-control manner, according to a respective transfer-function and at least one respective parameter vector. The system also includes a second controller (or second portion of a controller) coupled to control the first stage in a feed-forward-control manner, according to a respective transfer-function and at least one respective parameter vector. The first and second controllers are programmed to perform IFT including minimizing a cost-function that is a function of at least one respective parameter vector from each of the first and second controllers.

Embodiments of the system can further comprise a second stage that is movable relative to the process assembly. A third controller (or third portion of a controller) is coupled to receive data at least regarding respective position errors of the first and second stages and to control synchronous movement of the first and second stages, according to a respective transfer-function of at least one respective parameter vector of the third controller. The third controller can be programmed to perform IFT, in cooperation with the first and second controller, including minimization of a cost-function that is also a function of the at least one respective parameter vector of the third controller.

According to yet another aspect, methods are provided for controlling movement of at least a first stage. In an embodiment, a trajectory for the first stage is established. According to the trajectory, a control command is directed to the first stage to cause corresponding motion of the first stage. As the first stage moves according to the control command, position of the first stage is measured. In a feedback-control manner, the measured stage position is compared with the trajectory, and a respective position-error of the first stage is determined. From the position-error of the first stage, a first processed output is produced that is a function of at least a first parameter vector. A second processed output is produced that is a function of at least a second parameter vector different from the first parameter vector. The second processed output is fed-forward and combined with the first processed output. The first and second processed outputs are tuned by performing at least one iteration of IFT to minimize a cost-function that is a function of at least the first and second parameter vectors. The first stage is moved according to the tuned first and second processed outputs. The first position error of the first stage can include a following-error, and the second processed output cam be calculated from data concerning at least the trajectory of the first stage.

The method can further comprise determining a position error of the first stage relative to an expected position that otherwise would result from the trajectory. A position error of a second stage is determined, wherein motion of the second stage is to be synchronized with motion of the first stage. A third processed output is produced that is a function of at least a third parameter vector different from the first and second parameter vectors. The first stage is caused to move according to the first, second, and third processed outputs. The first, second, and third processed outputs can be tuned by performing at least one IFT iteration to minimize a cost-function that is a function of at least the first, second, and third parameter vectors. The first stage is moved according to the tuned first, second, and third processed outputs. The first stage can be a reticle stage, mask stage, or tool stage. The second stage is a substrate stage (or workpiece stage) placed relative to the first stage. The first and second stages can move substantially synchronously relative to each other.

The foregoing and additional features and advantages of the invention will be more readily apparent from the following detailed description, which proceeds with reference to the drawings.

BRIEF DESCRIPTION OF THE DRAWINGS

FIG. 3(A) is a graph including example curves representing an intended trajectory and an actual trajectory, as functions of time, during respective movements of a stage over multiple iterations.

FIG. 3(B) is a graph of an exemplary following-error of the stage producing the graphs of FIG. 3(A), as a function of time.

DETAILED DESCRIPTION

Figure 1:
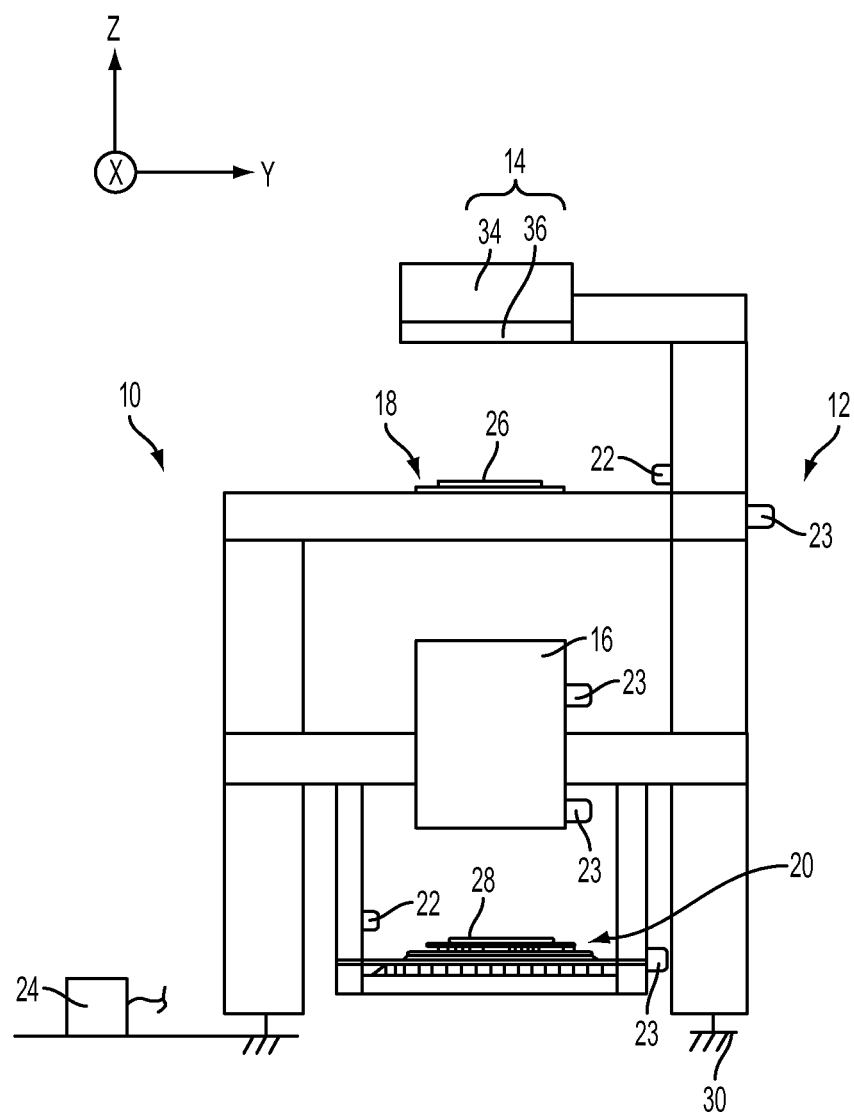
FIG. 1 is a schematic elevational view of an embodiment of a precision system, namely a photolithographic exposure system, including features as disclosed herein.
Figure 2A:
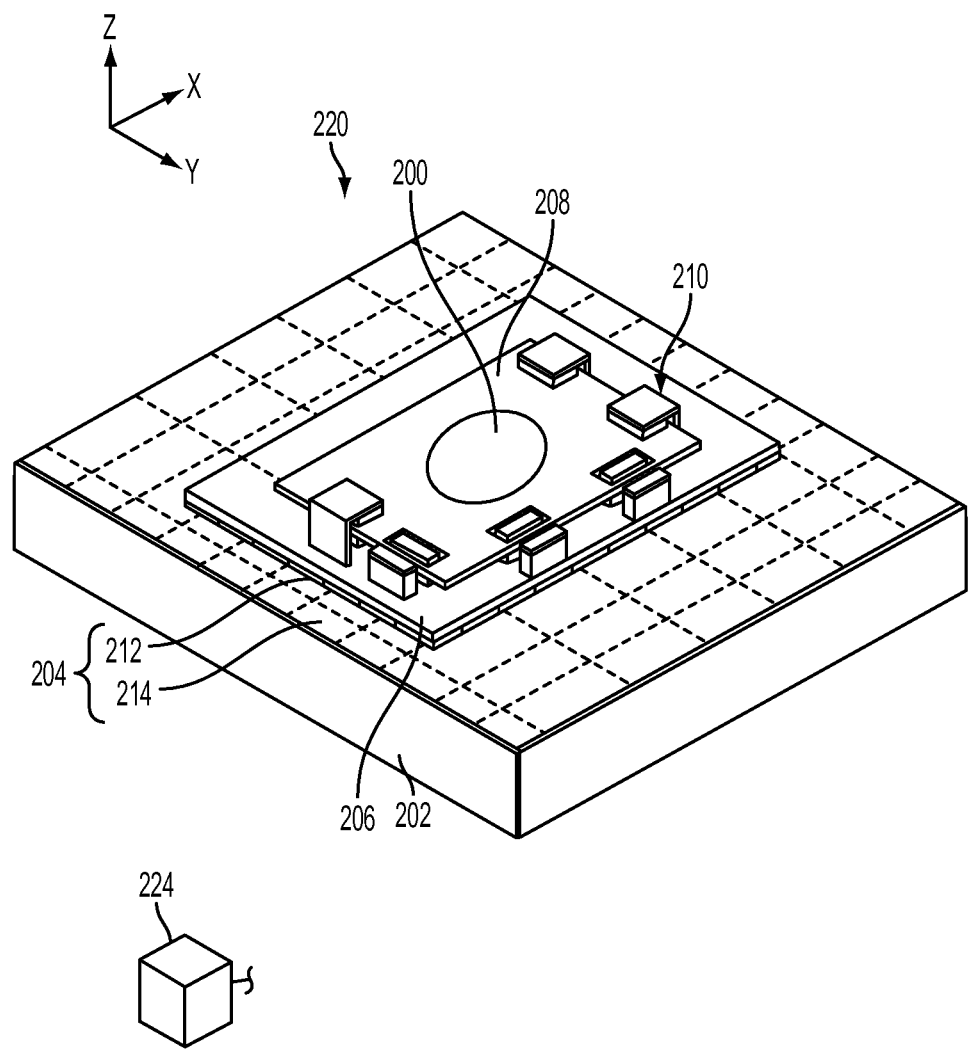
FIG. 2(A) is a perspective view of an embodiment of a stage assembly, usable with the system of FIG. 1 for example, and including features as disclosed herein.

This disclosure is set forth in the context of representative embodiments that are not intended to be limiting in any way.
Precision System FIG. 1 is a schematic illustration of an exemplary precision system, namely a microlithographic exposure apparatus 10, embodying the current invention. The exposure apparatus 10 includes an apparatus frame 12, an illumination system 14, an assembly 16 (e.g., an optical assembly), a reticle-stage assembly 18, a wafer-stage assembly 20, a measurement system 22, one or more sensors 23, and a control system 24. The respective configurations of the components of the exposure apparatus 10 can be varied to suit the design requirements of the exposure apparatus 10. Details of the exposure apparatus 10 are provided later below.
Stages FIG. 2(A) is a perspective view of an exemplary stage assembly 220 used for moving and positioning an object 200, and a control system 224 for the stage assembly. The stage assembly 220 can be used as, for example, the wafer-stage assembly 20 in the exposure apparatus 10 of FIG. 1, wherein the stage assembly 220 moves and positions the wafer 28 during manufacture of micro-devices on the wafer. The control system 224 can be a portion of the stage assembly 220 or can be located elsewhere in the exposure apparatus. Alternatively to being part of an exposure apparatus, the stage assembly 220 can be used for moving and positioning other types of objects 200 during manufacturing and/or inspection, such as moving and positioning an object under an electron microscope (not shown), or for moving and positioning an object during a precision measurement operation (not shown).

Further alternatively, for example, the stage assembly 220 can be used as the reticle-stage assembly 18 in the exposure apparatus 10 of FIG. 1, in which the stage assembly 220 moves and positions the reticle 26 during manufacture of micro-devices on the wafer 28.

The stage assembly 220 includes a stage base 202, a coarse-stage mover assembly 204, a coarse stage 206, a fine stage 208, and a fine-stage mover assembly 210. The configuration of the components of the stage assembly 220 can be varied as required. For example, in FIG. 2(A), the stage assembly 220 includes one coarse stage 206 and one fine stage 208. Alternatively, the stage assembly 220 is configured to include more or less than one coarse stage 206 or more or less than one fine stage 208. Herein, the terms "coarse stage" 206 and "fine stage" 208 can be used interchangeably with the first stage and the second stage, in either order. It will be understood that this particular stage assembly 220 is exemplary of various types of stage assemblies, and is in no way intended to be limiting. The stage assembly 220 can be constructed according to relevant industry standards that are generally known to those skilled in the art.

The stage base 202 is generally rectangularly shaped. Alternatively, the stage base 202 can be another shape. The stage base 202 supports some of the components of the stage assembly 220 above the mounting base 30 illustrated in FIG. 2(A).

The configuration of the coarse-stage mover assembly 204 can be varied to suit the movement requirements of the stage assembly 220. In one embodiment, the coarse-stage mover assembly 204 includes one or more movers, such as rotary motors, voice-coil motors, linear motors utilizing a Lorentz force to generate a driving force, electromagnetic actuators, planar motors, or other force actuators.

The coarse-stage mover assembly 204 moves the coarse stage 206 relative to the stage base 202 along the X-axis, along the Y-axis, and about the Z-axis (collectively "the planar degrees of freedom" x, y, and $\theta_z$, respectively). Additionally, the coarse-stage mover assembly 204 can be configured to move and position the coarse stage 206 along the Z-axis, about the X-axis and/or about the Y-axis relative to the stage base 202 (z, $\theta_x$, and $\theta_y$, respectively). Alternatively, for example, the coarse-stage mover assembly 204 can be configured to move the coarse stage 206 with fewer than three degrees of freedom.

In FIG. 2(A) the coarse-stage mover assembly 204 includes a planar motor, wherein a first mover component 212 is secured to and moves with the coarse stage 206 and a second mover component 214 (illustrated in phantom) is secured to the stage base 202. The configuration of each of these components can be varied. For example, one of the mover components 212, 214 can include a magnet array having a plurality of magnets and the other of the mover components 214, 212 can include a conductor array having a plurality of conductors.

In FIG. 2(A) the first mover component 212 includes the magnet array, and the second mover component 214 includes the conductor array. Alternatively, the first mover component 212 can include the conductor array and the second mover component 214 can include the magnet array. The size and shape of the conductor array and the magnet array and the number of conductors in the conductor array and the number of magnets in the magnet array can be varied to suit specific requirements.

The first mover component 212 can be maintained above the second mover component 214 using vacuum pre-load type air bearings (not shown). With this configuration, the coarse stage 206 is movable relative to the stage base 202 with three degrees of freedom (x, y, and $\theta_z$). Alternatively, the first mover component 212 could be supported above the second mover component 214 by other ways, such as guides, a rolling-type bearing, or by the magnetic levitation forces. Further alternatively or in addition, the coarse-stage mover assembly 204 can be configured to be movable with up to six degrees of freedom (x, y, z, $\theta_x$, $\theta_y$, $\theta_z$). Further alternatively, the coarse-stage mover assembly 204 can be configured to include one or more electromagnetic actuators.

The control system 224 directs electrical current to one or more of the conductors in the conductor array. The electrical current through the conductors causes the conductors to interact with the magnetic field of the magnet array. This generates a force between the magnet array and the conductor array that can be used to control, move, and position the first mover component 212 and the coarse stage 206 relative to the second mover component 214 and the stage base 202. The control system 224 adjusts and controls the current level for each conductor to achieve the desired resultant forces. In other words, the control system 224 directs current to the conductor array to position the coarse stage 206 relative to the stage base 202.

The fine stage 208 includes an object holder (not shown) that retains the object 200. The object holder can include a vacuum chuck, an electrostatic chuck, or clamp.

The fine-stage mover assembly 210 moves and adjusts the position of the fine stage 208 relative to the coarse stage 206. For example, the fine-stage mover assembly 210 can adjust the position of the fine stage 208 with six degrees of freedom (x, y, z, $\theta_x$, $\theta_y$, $\theta_z$). Alternatively, for example, the fine-stage mover assembly 210 can be configured to move the fine stage 208 with only three degrees of freedom. The fine-stage mover assembly 210 can include one or more rotary motors, voice-coil motors, linear motors, electromagnetic actuators, or other type of actuators. Further alternatively, the fine stage 208 can be fixed to the coarse stage 206.

Figure 2B:
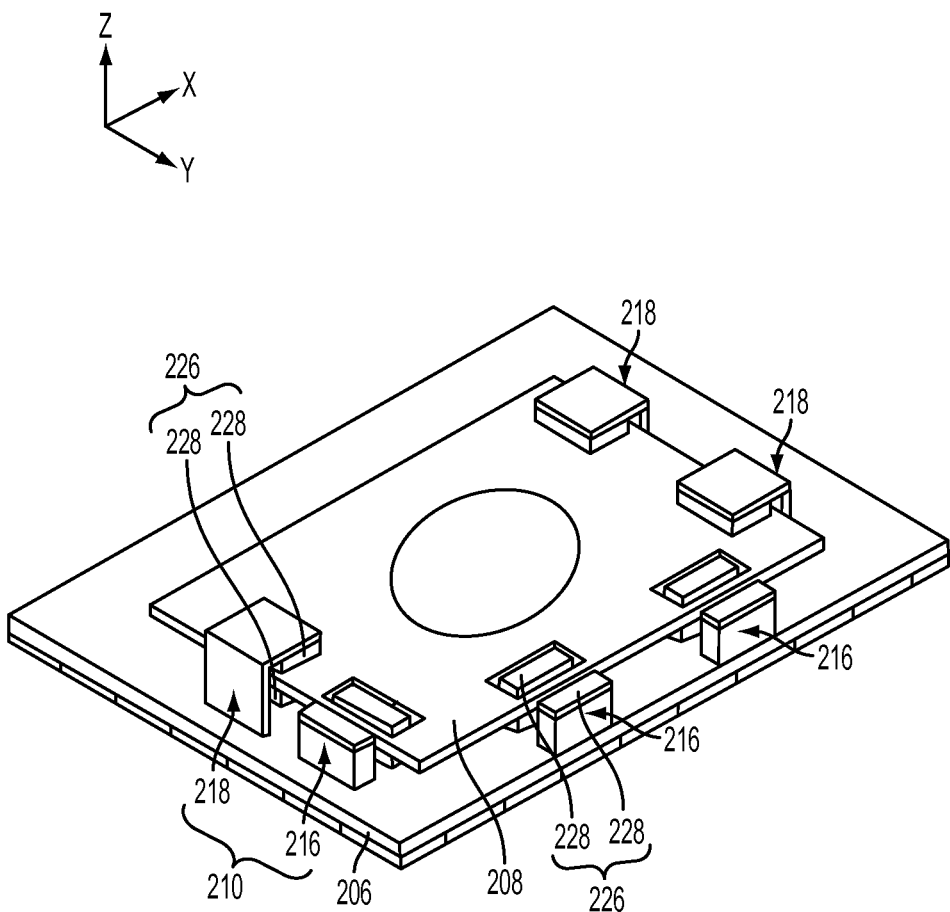
FIG. 2(B) is a perspective view of the stage assembly of FIG. 2(A).

FIG. 2(B) illustrates a perspective view of the coarse stage 206, the fine stage 208, and the fine-stage mover assembly 210 of FIG. 2(A). In this embodiment, the fine-stage mover assembly 210 includes three spaced-apart, horizontal movers 216 and three spaced-apart, vertical movers 218. The horizontal movers 216 move the fine stage 208 along the X-axis, along the Y-axis, and about the Z-axis (x, y, and $\theta_z$, respectively) relative to the coarse stage 206, while the vertical movers 218 move the fine stage 208 about the X-axis, about the Y-axis, and along the Z-axis ($\theta_x$, $\theta_y$, z, respectively) relative to the coarse stage 206.

In FIG. 2(B) each of the horizontal movers 216 and each of the vertical movers 218 includes a respective actuator pair 226 comprising two electromagnetic actuators 228 (illustrated as blocks in the figure). Alternatively, for example, one or more of the horizontal movers 216 and/or one or more of the vertical movers 218 can include a voice-coil motor or other type of mover.

One of the actuator pairs 226 (one of the horizontal movers 216) is mounted so that the attractive forces produced thereby are substantially parallel with the X-axis. Two of the actuator pairs 226 (two of the horizontal movers 216) are mounted so that the attractive forces produced thereby are substantially parallel with the Y-axis. Three actuator pairs 226 (the vertical horizontal movers 216) are mounted so that the attractive forces produced thereby are substantially parallel with the Z-axis. With this arrangement: (a) the horizontal movers 216 can make fine adjustments to the position of the fine stage 208 along the X-axis, along the Y-axis, and about the Z-axis (x, y, and $\theta_z$, respectively), and (b) the vertical movers 218 can make fine adjustments to the position of the fine stage 208 along the Z-axis, about the X-axis, and about the Y-axis (z, $\theta_x$, $\theta_y$, respectively).

Alternatively, for example, two actuator pairs 226 can be mounted parallel to the X-direction, and one actuator pair 226 can be mounted parallel to the Y-direction. Further alternatively, other arrangements of the actuator pairs 226 can be utilized.

In one embodiment, the measurement system 22 (FIG. 1) includes one or more sensors (not shown in FIG. 2(B)) that monitor the position of the fine stage 208 relative to the coarse stage 206 and/or the position of fine stage 208 relative to another structure, such as the assembly 16 (FIG. 1). Data from the measurement system 22 are provided to the control system 224 as provided herein.

Figure 2C:
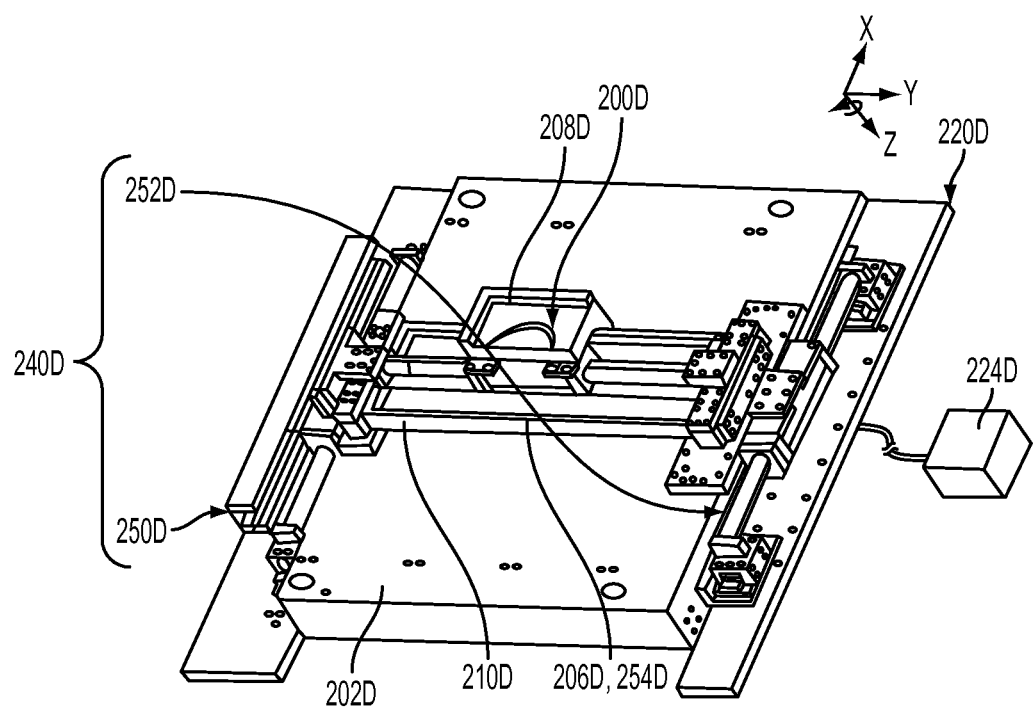
FIG. 2(C) is a perspective view of an embodiment of another stage assembly, including features as disclosed herein, usable with the system of FIG. 1, for example.

FIG. 2(C) is a perspective view of another embodiment of a stage assembly 220D that can be used to position an object 200D, and a control system 224D having features of the present invention. The stage assembly 220D includes a stage base 202D, an X-mover assembly 204D, a Y-mover assembly 206D, a stage 208D that retains the object 200D, and a guide assembly 210D. In this embodiment, the X-mover assembly 204D includes a first X-mover 250D and a second X-mover 252D that move the guide assembly 210D and the stage 208D along the X-axis and about the Z-axis (x and $\theta_z$, respectively). The Y-mover assembly 206D includes a Y-mover 254D that moves the stage 208D along the Y-axis. The number of X-movers and Y-movers can vary, and the number of mover assemblies can vary. Also, the design of the other components of the stage assembly 220D can be varied. The stage assembly 220D is described in greater detail in U.S. patent application Ser. No. 09/557,122, filed on Apr. 24, 2000, incorporated herein by reference. The stage assembly 220D can be configured in accordance with industry standards that are generally known to those skilled in the art and/or in accordance with the stage assembly disclosed in the '122 U.S. application cited above.

The stage assembly 220D or the stage assembly 220 (FIG. 2(A)) can be used to move the object 200, 200D during one or more iterations. As defined herein, a "first iteration" is said to be identical or similar to a "second iteration" if the first iteration includes a first intended trajectory that is identical or a similar to a second intended trajectory of the second iteration. There are many different examples of first and second intended trajectories of the stage, including trajectories that are identical or similar. Two or more intended trajectories can be considered iterations or iterative movements relative to each other under various circumstances. Example trajectories are discussed in paragraphs [0094]-[0114] and shown in FIGS. 3A-3M of U.S. Patent Publication No. 2004/0128918, incorporated herein by reference.

Stage-Movement Iterations

FIG. 3(A) is a graph providing an overview of an actual and an intended simplified back-and-forth type of iterative movement of a stage, such as the fine stage 208 shown in FIG. 2(A) or the stage 208D of FIG. 2(B), along a single axis as a function of time over the course of a plurality of substantially similar iterations of the stage. The curve 310 (shown as a solid line) illustrates the actual trajectory of the stage, and the curve 312 (shown as a dashed line) illustrates the intended trajectory of the stage. The spacing between the curves 310, 312 has been exaggerated for illustrative purposes. Each iteration can include the intended trajectory of the stage and the actual trajectory of the stage that emulates the intended trajectory. Two or more intended trajectories can be considered iterations under various circumstances, as discussed in U.S. Provisional Application No. 60/424,506.

For illustrative purposes, FIG. 3(A) includes a first iteration 300, a second iteration 302, a third iteration 304, and a portion of a fourth iteration 306, which is also referred to herein as the "current iteration." The actual trajectory 310 of an iteration may be substantially similar to the actual trajectory 310 of the previous iteration, although the identical trajectories 310 for each iteration 300-306 may not necessarily be identical. For example, during the first iteration 300 at times $t1_1$, $t2_1$, $t3_1$, $t4_1$, and $t5_1$, the measured position of the stage is located at positions $P_1$, $P_2$, $P_3$, $P_4$, and $P_5$ (hereinafter the "actual position"), respectively. Somewhat similarly, the second iteration 302 includes times $t1_2$ through $t5_2$, the third iteration 304 includes times $t1_3$ through $t5_3$, and the fourth iteration 306 includes times $t1_4$ through $t3_4$. Each of the times $t1_2$ through $t5_2$ of the second iteration 302 and the times $t1_3$ through $t5_3$ of the third iteration 304 has an actual position that is similar, though not necessarily identical, to a corresponding actual position $P_1$ through $P_5$, respectively. Each of the times $t1_4$ through $t3_4$ of the fourth iteration 306 has an actual position point that is similar, though not necessarily identical, to a corresponding actual position $P_1$ through $P_3$, respectively. It is recognized that the second and third iterations 302, 304, although similar in movement to previous first and second iterations 300, 302, respectively, can vary somewhat as a result of the additional information collected and utilized by the control system 24 and subsequent adjustments that the control system 24 makes in directing current to the one or more mover assemblies to cause forces that more accurately move the stage.

FIG. 3(B) shows an example of the following error 314 of the stage over the first, second, third, and fourth iterations 300, 302, 304, 306 based on the intended trajectory 312 and the actual trajectory 310 illustrated in FIG. 3(A).

During tuning, a desired trajectory is made and the respective data on position and velocity, for example, of the stage are saved. These data can be applied to the control of subsequent trajectories. It will be understood that the above merely describes an example, and the "similarity" between the actual trajectory of an iteration and the actual trajectory of the previous iteration may be more general. After tuning, for instance, the velocity and shot-size of the stage may be changed.

Controlled Stage Operation

Figure 4:
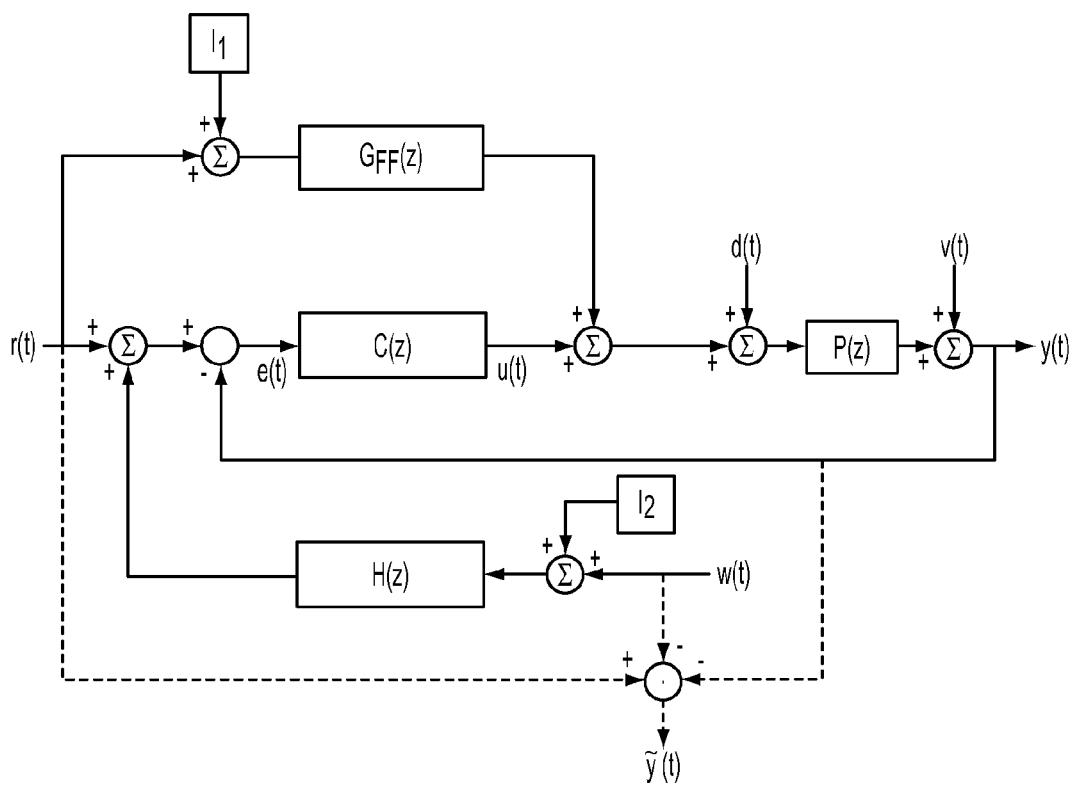
FIG. 4 is a general control diagram of an embodiment of a stage-control system.

An embodiment of a stage-control system is shown in FIG. 4, in which a first stage with its actuators is denoted by P(z), indicating the "plant." The system includes a feedback controller C(z), coupled downstream of the first stage P(z), that produces a command output u(t) routed to the first stage P(z). The input to the feedback controller C(z) includes data concerning at least the following-error e(t) of the first stage P(z). The output u(z) of the feedback controller C(z) is summed with the output of a feed-forward controller $G_{FF}(z)$ coupled to receive the stage trajectory r(t) and optionally other input data $I_1(t)$. The output of the feed-forward controller $G_{FF}(z)$ is summed with the output u(t) of the feedback controller C(z). The resulting sum is summed with disturbance d(t) upstream of the stage P(z). Noise v(t) is introduced downstream of the first stage P(z), where the noise is summed with the sensed output error y(t). The output error y(t) is coupled back, in a feedback manner, to upstream of the feedback controller C(z). Summed with r(t) upstream of the feedback controller C(z) is the output of a synchronization controller H(z) coupled to receive data concerning the following-error w(t) of a second stage whose movements are being coordinated with movement of the first stage P(z). If desired, the synchronization controller H(z) can be coupled to receive other input data $I_2(t)$. Note that the difference r(t)−y(t) yields a synchronization error ỹ(t).

Depending upon the particular application, either the synchronization controller H(z) or the feed-forward controller $G_{FF}(z)$ is optional. Alternatively, both can be present, as shown. These controllers H(z), $G_{FF}(z)$, as present, as well as the feedback controller C(z) are programmed to perform iterative feedback tuning (IFT) described in detail below.

The following discussion is presented in the context of the feedback controller C(z) controlling position and movement of a stage. But, this discussion is generally applicable to other controllers as well.

A control system in general operates to control the positioning of the plant (in this case a stage). An intended trajectory r(t) of the stage P is established based on the desired path of the stage. The intended trajectory r(t) is relative to at least one axis, such as along the X-axis, along the Y-axis, and/or about the Z-axis ($\theta_z$), for example. The intended trajectory r(t) may also include components about the X-axis ($\theta_x$), about the Y-axis ($\theta_w$), and/or along the Z-axis, or any combination thereof.

The intended trajectory r(t) is compared with the actual trajectory of the stage P to determine whether the stage is properly positioned. The actual trajectory is determined by a measurement system (e.g., item 22 in FIG. 1) associated with the stage P and that generates a sensor signal. The measurement system measures the current position of the stage P, and thus of the object (e.g., item 26 in FIG. 1), relative to another structure (e.g., the assembly 16 in FIG. 1). The sensor signals are routed to one or more controllers including the feedback controller C(z). Each sensor signal provides data relating to the actual position of the stage P in one or more degrees of freedom at a specific point in time. The following error e(t) for the stage is determined by computing the difference between the intended trajectory r(t) and the actual trajectory y(t) at a specific point in time. Based at least on the magnitude of the following error e(t), the control law (transfer function) of the controller C(z) determines the extent to which electrical current being (or to be) supplied to one or more mover assemblies of the stage P should be adjusted, if at all.

After the control law determines the current, the current is distributed as a "force command" u(t) to the one or more mover assemblies of the stage P, as appropriate. The mover assemblies then move the stage P, causing it to follow more accurately the intended trajectory r(t). Data on the position of the stage, or object thereon, is then compared with a corresponding position based on the trajectory r(t) to increase positioning accuracy.

Referring again to FIG. 4, in various embodiments the feedback controller C(z) and at least the feed-forward controller $G_{FF}(z)$ are programmed to perform IFT. If both the feed-forward controller $G_{FF}(z)$ and synchronization controller H(z) are present, then at least one of these controllers is programmed to perform IFT.

General Aspects of Iterative Feedback Tuning

Iterative Feedback Tuning (IFT) is an adaptive control technique that originally was developed for tuning of feedback-control filters. Hjalmarsson, "Iterative Feedback Tuning—An Overview," Int. *J. Adaptive Control and Signal Processing* 16:373-395 (2002). IFT is an iterative technique in which the parameters of a controller are successively updated using data from closed-loop "experiments" and proceeding to an updated "law" for the control parameters. Controller parameters are updated by minimizing a specified cost-function using gradient-search techniques, and the gradients are estimated from data obtained from iterative experiments. Controller parameters are changed iteratively with the goal of improved performance in subsequent iterations. In other words, IFT is a gradient-based optimization technique in which controller parameters are updated according to the gradient of the cost-function and according to Hessian Matrices (approximate second-order gradients). No plant model or other explicit model of the system to be controlled is required, and the tuning algorithm can be executed without interrupting closed-loop control. In contrast to other gradient-based methods, in IFT the gradient of the cost-function in each iteration is directly measured from only one or a few additional experiments.

Feedback control involving IFT is performed using a feedback controller controlling at least one control parameter, which can be designated ρ. The cost-function for the IFT is a function of the parameter vector $\bar{\rho}$ corresponding to ρ. The cost-function is evaluated in a first "experiment" and a gradient of the cost-function is determined and evaluated in a second "experiment." With each successive iteration of IFT, the cost-function is evaluated and a respective gradient of the cost-function is determined and evaluated. In each iteration, the results of the evaluations are applied by the feedback controller to tune the parameter vector in a way that reduces the cost-function.

Figure 5:
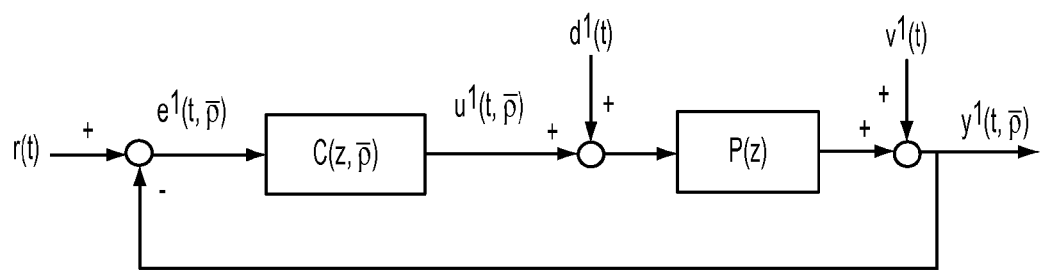
FIG. 5 is a control diagram of a system in which feedback control of a stage includes iterated feedback tuning (IFT).

Shown in FIG. 5 is a general closed-loop control system subject to a disturbance force $d^1$ and noise $v^1$, both of which are assumed not to be correlated with the trajectory command for unbiased estimation. The superscript "1" above certain variables denotes experiment 1. In experiment 1 the output $y^1$, control-command $u^1$, and following-error $e^1$ are all functions of a vector of a control parameter $\rho^1$, the vector being denoted "$\bar{\rho}$." This vector is to be tuned. In a typical feedback manner, the output $y^1$ is routed back and used in a determination of a following-error $e^1$. The following-error is an output error.

The cost function $J(\bar{\rho})$ can be described as follows, including both a weighted output-error and a control-command:

$$J(\bar{\rho}) = \frac{1}{2N} E\left[\underbrace{\sum_{t=1}^{N}(L_y(z)e^1(t,\bar{\rho}))^2}_{Output\text{-}error} + \lambda \underbrace{\sum_{t=1}^{N}(L_u(z)u^1(t,\bar{\rho}))^2}_{Control}\right] \quad (1A)$$

wherein $e^1(t,\bar{\rho})=r^1(t)-y^1(t,\bar{\rho})$ is an output-error (between achieved and desired output response). E denotes an expectation with respect to a disturbance or noise, $u^1(t,\bar{\rho})$ is a control-command from the feedback controller to the plant P(z), t is time, N is number of data points, and r(t) denotes a reference signal normally independent of disturbance or noise. $L_y(z)$ and $L_u(z)$ are frequency-weighting functions for output-error and control, respectively, and are helpful for shaping a gradient filter using previously obtained knowledge about the dynamics of the plant P(z) for better convergence, performance, and stability robustness. The factor $\lambda$ is a scaling factor for the control relative to the output-error.

In IFT, the cost function is minimized with respect to the parameter vector $\bar{\rho}$, which is equivalent to finding a solution for the following:

$$0 = \frac{\partial J(\bar{\rho})}{\partial \bar{\rho}} = \frac{1}{N} E\left[\sum_{t=1}^{N} e^1(t,\bar{\rho}) \frac{\partial e^1(t,\bar{\rho})}{\partial \bar{\rho}} + \lambda \sum_{t=1}^{N} u^1(t,\bar{\rho}) \frac{\partial u^1(t,\bar{\rho})}{\partial \bar{\rho}}\right] \quad (1B)$$

The solution can be obtained using a stochastic approximation algorithm, and requires, for each iteration, obtaining the quantities $e(t,\bar{\rho})$, $u(t,\bar{\rho})$, $$\frac{\partial e(t,\bar{\rho})}{\partial \bar{\rho}}, \text{ and } \frac{\partial u(t,\bar{\rho})}{\partial \bar{\rho}},$$

and unbiased estimates of $$e(t,\bar{\rho})\left(\frac{\partial e(t,\bar{\rho})}{\partial \bar{\rho}}\right) \text{ and } u(t,\bar{\rho})\left(\frac{\partial u(t,\bar{\rho})}{\partial \bar{\rho}}\right).$$

These are evaluated in the second experiment.

Figure 6:
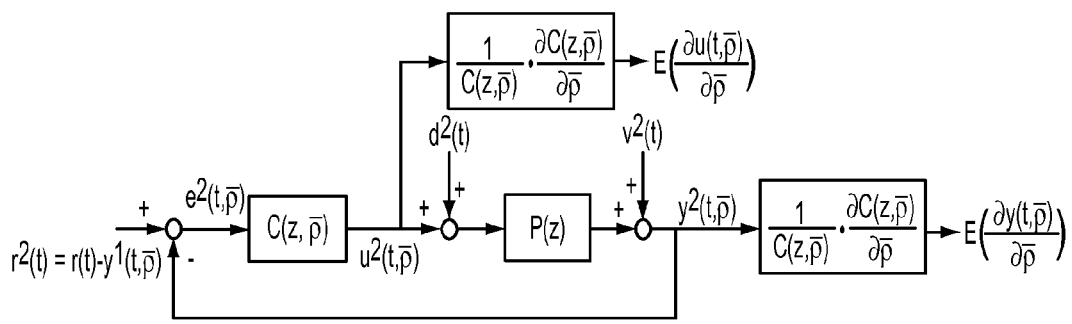
FIG. 6 is a control diagram of a gradient evaluation performed by the IFT aspect of the system of FIG. 5.

To estimate the direction for the next optimization step, a gradient-measurement experiment is performed, using the error in the evaluation of the cost-function $J(\bar{\rho})$, evaluated in the first experiment as the reference. This second experiment illustrated by the block diagram in FIG. 6. For unbiased estimation, the disturbance $d^2(t)$ and noise $v^2(t)$ in the second experiment are assumed to be independent of $d^1(t)$ and $v^1(t)$, respectively, in the first experiment.

The parameter gradients of control and output, $$\frac{\partial u^1}{\partial \bar{\rho}}, \frac{\partial y^1}{\partial \bar{\rho}},$$

respectively, can be evaluated (either on-line or off-line) from the control signal $u^2(t)$ and output signal $y^2(t)$, respectively, obtained via a "gradient filter"

$$\frac{1}{C}\frac{\partial C}{\partial \bar{\rho}}, \text{ where } \frac{\partial C}{\partial \bar{\rho}}$$

is a vector. The vector describes the parameter gradients of the control filter that appear in the gradient filter:

$$\frac{\partial C(z,\bar{\rho})}{\partial \bar{\rho}} = \left[\frac{\partial C(z,\bar{\rho})}{\partial \rho_1} \frac{\partial C(z,\bar{\rho})}{\partial \rho_2} \cdots \frac{\partial C(z,\bar{\rho})}{\partial \rho_j} \cdots \frac{\partial C(z,\bar{\rho})}{\partial \rho_{n_p}}\right]^T \quad (2)$$

Upon completing the gradient-measurement experiment, the control parameter $\bar{\rho}$ is updated from iteration i to iteration i+1 as follows:

$$\bar{\rho}_{i+1} = \bar{\rho}_i - \gamma_i R_i^{-1} E\left(\frac{\partial J(\bar{\rho}_i)}{\partial \bar{\rho}}\right) \quad (3)$$

where the step size $\gamma_i > 0$, and $R_i$ is an appropriate positive definite matrix such as a Hessian matrix. The gradient of the cost-function may be estimated as follows with the measured parameter gradients $$\frac{\partial u}{\partial \bar{\rho}}, \frac{\partial y}{\partial \bar{\rho}}:$$

$$E\left(\frac{\partial J(\bar{\rho})}{\partial \bar{\rho}}\right) = \frac{1}{N} E\left[\sum_{t=1}^{N}(L_y(z)e^1(t,\bar{\rho}))\left(L_y(z)\frac{\partial y^1(t,\bar{\rho})}{\partial \bar{\rho}}\right) + \quad (4)\right.$$

-continued $$\lambda \sum_{t=1}^{N} (L_u(z)u^1(t,\bar{p}))\left(L_u(z)\frac{\partial u^1(t,\bar{p})}{\partial \bar{p}}\right)\right]$$

The Hessian Matrix (second-order gradient of the cost-function) is approximated as described below with the measured parameter gradients, $$\frac{\partial u}{\partial \bar{p}}, \frac{\partial y}{\partial \bar{p}}.$$

$$R_i = \frac{1}{N} \sum_{t=1}^{N} \left[ E\left(L_y(z)\frac{\partial y^1(t,\bar{p})}{\partial \bar{p}}\right) E\left(L_y(z)\frac{\partial y^1(t,\bar{p})}{\partial \bar{p}}\right)^T + \lambda E\left(L_u(z)\frac{\partial u^1(t,\bar{p})}{\partial \bar{p}}\right) E\left(L_u(z)\frac{\partial u^1(t,\bar{p})}{\partial \bar{p}}\right)^T \right] \quad (5)$$

Output:

$$\frac{\partial y^1(t,\bar{p})}{\partial \bar{p}} = \frac{\partial}{\partial \bar{p}}\left(\frac{PC}{1+PC}\right)r^1(t) = \left(\frac{P}{1+PC} - \frac{P^2C}{(1+PC)^2}\right)\frac{\partial C}{\partial \bar{p}}r^1(t) \quad (6)$$

$$= \frac{1}{C}\frac{\partial C}{\partial \bar{p}}\left(\frac{PC}{1+PC}\right)\left(1 - \frac{PC}{1+PC}\right)r^1(t) =$$

$$\underbrace{\frac{1}{C}\frac{\partial C}{\partial \bar{p}}}_{\text{gradient filter}}\underbrace{\left(\frac{PC}{1+PC}\right)}_{y^2(t)}\underbrace{(r^1(t) - y^1(t))}_{r^2(t)=e^1(t,\bar{p})}$$

Control:

$$\frac{\partial u^1(t,\bar{p})}{\partial \bar{p}} = \frac{\partial}{\partial \bar{p}}\left(\frac{C}{1+PC}\right)r^1(t) = \left(\frac{1}{1+PC} - \frac{PC}{(1+PC)^2}\right)\frac{\partial C}{\partial \bar{p}}r^1(t)$$

The equations above indicate that the gradients are directly measurable with a redefined reference from the same closed-loop system.

A list of control gradient filters, $$\frac{1}{C}\frac{\partial C}{\partial \bar{p}},$$

is provided in Table 1, below.

TABLE 1

| $\rho$ | $k_p$ | $k_i$ | z | p | $w_1$ | $d_1$ | $w_2$ | $d_2$ |
|---|---|---|---|---|---|---|---|---|
| $C(s)$ | $k_p$ | $\frac{s+k_i}{s}$ | $\frac{\frac{s}{z}+1}{\frac{s}{p}+1}$ | $\frac{\frac{s}{z}+1}{\frac{s}{p}+1}$ | | | $\frac{\frac{s^2}{w_1^2}+2d_1\frac{s}{w_1}+1}{\frac{s^2}{w_2^2}+2d_2\frac{s}{w_2}+1}$ | |
| $\frac{1}{C}\frac{\partial C}{\partial \rho}$ | $\frac{1}{k_p}$ | $\frac{1}{s+k_i}$ | $\frac{-\frac{s}{z^2}}{\frac{s}{z}+1}$ | $\frac{\frac{s}{p^2}}{\frac{s}{p}+1}$ | $\frac{-2\frac{s^2}{w_1^3}-2d_1\frac{s}{w_1^2}}{\frac{s^2}{w_1^2}+2d_1\frac{s}{w_1}+1}$ | $\frac{2\frac{s}{w_1}}{\frac{s^2}{w_1^2}+2d_1\frac{s}{w_1}+1}$ | $\frac{2\frac{s^2}{w_2^3}+2d_2\frac{s}{w_2^2}}{\frac{s^2}{w_2^2}+2d_2\frac{s}{w_2}+1}$ | $\frac{-2\frac{s}{w_2}}{\frac{s^2}{w_2^2}+2d_2\frac{s}{w_2}+1}$ |

After updating the control parameters, the first and second experiments are repeated in one or more subsequent iterations until a termination condition for the optimization is satisfied.

The following analytical gradient operations for output and control, respectively, are useful for understanding IFT as utilized herein. The plant output position in the first experiment 1 is driven by the feedback controller as follows:

$$y^1(t,\bar{p}) = \frac{P(z)C(z,\bar{p})}{1+P(z)C(z,\bar{p})}r(t),$$

which is abbreviated $$\left(\frac{PC}{1+PC}\right)r(t).$$

In Table 1 the subscripts represent polynomial orders.

Based on the above, application of IFT to feed-forward control and synchronization control is described below.

First Embodiment

IFT for Feed-Forward and Feedback Control

In this embodiment IFT is used not only in feedback control but also in feed-forward control of stage positioning and movement. The movement can be step-wise, continuous (e.g., scanning), or a combination of these.

Figure 7:
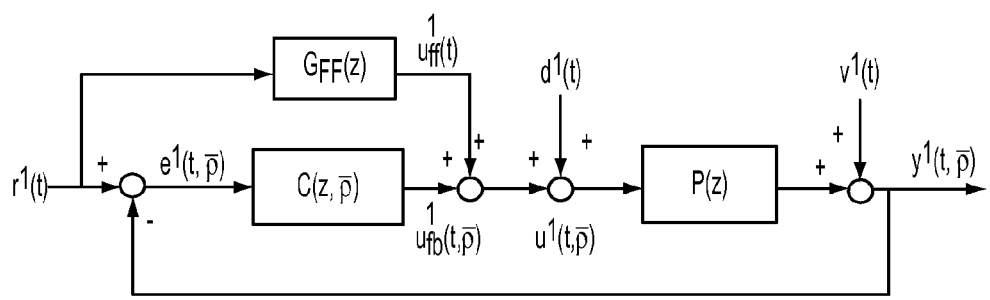
FIG. 7 is a control diagram of a system according to the first embodiment, in which both feedback control and feed-forward control of a stage include IFT.

The general closed-loop system is shown in FIG. 7, including disturbance force $d^1$ and noise $n^1$ (superscripts denote experiment 1). Both disturbance and noise are assumed not to be correlated to the trajectory command, for unbiased estimation. The vector of control parameters to be tuned is denoted $\bar{\rho}$.

The cost function to be minimized is described as follows, including both weighted error and control command:

$$J(\bar{p}) = \frac{1}{2N}\left[\sum_{t=1}^{N}(L_y(z)e^1(t,\bar{p}))^2 + \lambda\sum_{t=1}^{N}(L_u(z)u_{fb}^1(t,\rho))^2\right] \quad (8)$$

in which $e^1(t,\bar{\rho})=r^1(t)-y^1(t,\bar{\rho})$ is following-error in the first experiment, $u_{fb}^1$ is the control command in the first experiment, $L_y(z)$ and $L_u(z)$ are frequency-weighting functions for output error and control, respectively. The weighting functions are useful in shaping the filter with known information concerning the plant dynamics for better convergence and robustness of performance and stability. The factor $\lambda$ is a scaling factor between output error and control.

A Gauss-Newton gradient method is used to minimize the cost-function. Parameter updating from iteration i to iteration i+1 depends upon step size, the gradients of the cost-function, and the Hessian matrix:

$$\bar{p}_{i+1} = \bar{p}_i - \gamma_i R_i^{-1}\frac{\partial J(\bar{p}_i)}{\partial \bar{p}} \quad (9)$$

in which the step size $1 \geq \gamma_i > 0$. The gradient of the cost-function may be estimated as set forth below, using $$\frac{\partial u_{fb}^1}{\partial \bar{p}}, \frac{\partial y^1}{\partial \bar{p}}$$

from experiment 2:

$$\frac{\partial J(\bar{p}_i)}{\partial \bar{p}} = \frac{1}{N}\left\{\sum_{t=1}^{N}(L_y(z)e^1(t,\bar{p}))\left(-L_y(z)\frac{\partial y^1(t,\bar{p})}{\partial \bar{p}}\right) + \lambda\sum_{t=1}^{N}(L_u(z)u_{fb}^1(t,\bar{p}))\left(L_u(z)\frac{\partial u_{fb}^1(t,\bar{p})}{\partial \bar{p}}\right)\right\} \quad (10)$$

The Hessian matrix (second-order gradient of the cost-function) is approximated below with the measured $$\frac{\partial u_{fb}^1}{\partial \bar{p}}, \frac{\partial y^1}{\partial \bar{p}}$$

from experiment 2:

$$R_i = \frac{1}{N}\sum_{t=1}^{N}\left\{\left(L_y(z)\frac{\partial y^1(t,\bar{p})}{\partial \bar{p}}\right)\left(-L_y(z)\frac{\partial y^1(t,\bar{p})}{\partial \bar{p}}\right)^T + \lambda\left(L_u(z)\frac{\partial u_{fb}^1(t,\bar{p})}{\partial \bar{p}}\right)\left(L_u(z)\frac{\partial u_{fb}^1(t,\bar{p})}{\partial \bar{p}}\right)^T\right\} \quad (11)$$

The stage output position in experiment 1 is driven by the feedback and feed-forward controllers:

$$y^1(t,\bar{p}) = \frac{P(z)G_{FF}(z) + P(z)C(z,\bar{p})}{1 + P(z)C(z,\bar{p})}r(t) \quad (12)$$

The associated parameter-gradient vector is derived as follows:

$$\frac{\partial y^1(t,\bar{p})}{\partial \bar{p}} = \frac{\partial}{\partial \bar{p}}\left(\frac{P(z)G_{FF}(z) + P(z)C(z,\bar{p})}{1 + P(z)C(z,\bar{p})}\right)r^1(t) \quad (13)$$

$$= \left(\frac{P(z)}{1 + P(z)C(z,\bar{p})} - \frac{(P(z)G_{FF}(z) + P(z)C(z,\bar{p}))P(z)}{(1 + P(z)C(z,\bar{p}))^2}\right)\frac{\partial C(z,\bar{p})}{\partial \bar{p}}r^1(t)$$

$$= \underbrace{\frac{1}{C(z,\bar{p})}\left(\frac{\partial C(z,\bar{p})}{\partial \bar{p}}\right)\left(\frac{P(z)C(z,\bar{p})}{1 + P(z)C(z,\bar{p})}\right)}_{\text{gradient filter}}\underbrace{\left(1 - \frac{P(z)G_{FF}(z) + P(z)C(z,\bar{p})}{1 + P(z)C(z,\bar{p})}\right)r^1(t)}_{r^2(t)=e^1(t,\bar{p})}$$

$$= \underbrace{\frac{1}{C(z,\bar{p})}\left(\frac{\partial C(z,\bar{p})}{\partial \bar{p}}\right)\left(\frac{P(z)C(z,\bar{p})}{1 + P(z)C(z,\bar{p})}\right)}_{\text{gradient filter}}\underbrace{(r^1(t)-y^1(t,\bar{p}))}_{y^2(t,p)}$$

If $r^2(t)$ is defined as:

$$r^2(t) = r^1(t) - y^1(t,\bar{p}) = e^1(t,\bar{p}), \quad (14)$$

and $$y^2(t,\bar{p}) = \frac{P(z)C(z,\bar{p})}{1 + P(z)C(z,\bar{p})}r^2(t), \quad (15)$$

then $$\frac{\partial y^1(t,\bar{p})}{\partial \bar{p}} = \underbrace{\frac{1}{C(z,\bar{p})}\left(\frac{\partial C(z,\bar{p})}{\partial \bar{p}}\right)}_{\text{gradient filter}} \cdot y^2(t,\bar{p}) \quad (16)$$

The feedback control in experiment 1 is as follows:

$$u_{fb}^1(t,\bar{p})=C(z,\bar{p})(r^1(t)-y^1(t,\bar{p})), \quad (17)$$

and its associated parameter vector is:

$$\frac{\partial u_{fb}^1(t,\bar{p})}{\partial \bar{p}} = \frac{\partial C(t,\bar{p})}{\partial \bar{p}}(r^1(t)-y^1(t,\bar{p})) - C(z,\bar{p})\frac{\partial y^1(t,\bar{p})}{\partial \bar{p}}, \quad (18)$$

which can be simplified as follows:

$$\frac{\partial u_{fb}^1(t,\bar{p})}{\partial \bar{p}} = \frac{\partial C(z,\bar{p})}{\partial \bar{p}}(r^2(t) - y^2(t,\bar{p})) \quad (19)$$

$$= \frac{1}{C(z,\bar{p})}\left(\frac{\partial C(z,\bar{p})}{\partial \bar{p}}\right) \cdot \underbrace{C(z,\bar{p})(r^2(t)-y^2(t,\bar{p}))}_{u_{fb}^2(t,\bar{p})}$$

$$= \underbrace{\frac{1}{C(z,\bar{p})}\left(\frac{\partial C(z,\bar{p})}{\partial \bar{p}}\right)}_{\text{gradient filter}} \cdot u_{fb}^2(t,\bar{p}).$$

Figure 8:
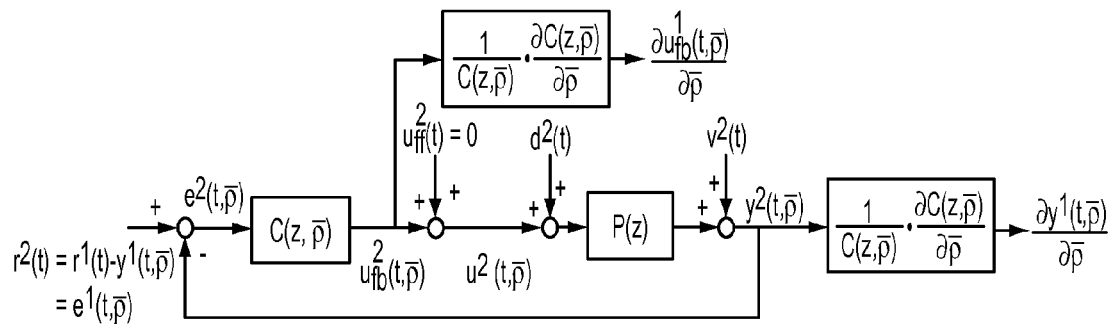
FIG. 8 is a control diagram of a gradient evaluation performed by the IFT aspect of the system of FIG. 7.

To estimate the direction for the next optimization step, a gradient-measurement experiment (experiment 2) is performed, which can be configured based on Equations (14), (15), (16), and (17). As a reference, the error in experiment 1 is used, as illustrated in FIG. 8. For unbiased estimation, the disturbance and noise here are assumed to be independent of those in experiment 1.

The parameter gradients of control and output $$\frac{\partial u_{fb}^1}{\partial \bar{\rho}}, \frac{\partial y^1}{\partial \bar{\rho}},$$

(respectively) can be evaluated (either on-line or off-line) from the control and output signals obtained in this experiment through the "gradient filter"

$$\frac{1}{C}\frac{\partial C}{\partial \bar{\rho}}, \text{ where } \frac{\partial C}{\partial \bar{\rho}}$$

is a vector:

$$\frac{\partial C(z,\bar{\rho})}{\partial \bar{\rho}} = \left[ \begin{array}{cccccc} \frac{\partial C(z,\bar{\rho})}{\partial \rho_1} & \frac{\partial C(z,\bar{\rho})}{\partial \rho_2} & \cdots & \frac{\partial C(z,\bar{\rho})}{\partial \rho_j} & \cdots & \frac{\partial C(z,\bar{\rho})}{\partial \rho_{n_\rho}} \end{array} \right]^T \quad (20)$$

After updating the control parameters with Equations (b), (c), and (d), experiments 1 and 2 can be repeated until the termination condition for the optimization is satisfied.

A list of control gradient filters is as provided in Table 1, above.

Example 1

In this example of the first embodiment, the feedback filter was tuned to improve settling performance of the stage undergoing a scanning motion. A reticle stage was used, having a mass of 10 kg, 2000-Hz bandwidth amplifiers, and four-samples delay (1 Ts=96×10$^{-6}$ sec. For cost-function evaluations, the stage is caused to execute two 33-mm shots at 2.8 m/s scanning velocity and an average acceleration of 10×g, with a 2 msec settling time. The position trajectory was delayed by four samples to synchronize the system delay.

An evaluation was performed of the following cost-function, expressed as a weighted mean-square sum of the following-error and the feedback force:

$$J(\bar{\rho}) = \frac{1}{2}\sum_{k=1}^{2} \frac{1}{2N}\left[\sum_{t=1}^{N}(e^1(t,\bar{\rho}))^2 + \lambda\sum_{t=1}^{N}(u_{fb}^1(t,\bar{\rho}))^2\right]_{shot \# k},$$

wherein $\lambda = 1 \times 10^{-16}$. The magnitude ratio between the following-error and the feedback force is approximately $10^{-8}$, so the value of $\lambda$ stated above can be used as the weighting between the square sums of the feedback force and the following-error in the cost-function. With selected weighting, and over multiple iterations, the following-error converged and the closed-loop system remained stable.

Second Embodiment

IFT for Feedback, Feed-Forward, and Synchronization Control

In this embodiment IFT is used for both feedback control and feed-forward control of a first stage (e.g., reticle stage) as well as synchronization control of the first stage with a second stage (e.g., wafer stage). In synchronization control, motion of the reticle stage is coordinated with motion of the wafer stage, and vice versa.

The first IFT experiment involves evaluation of the cost-function $J(\bar{\rho},\bar{\sigma},\bar{\phi})$. See the control diagram in FIG. 9, in which C is the feedback controller for the reticle stage, $G_{FF}$ is the feed-forward controller for the reticle stage, H is the synchronization controller for the reticle stage versus wafer stage, and P is the plant (reticle stage, including reticle-stage actuators). The feedback controller C has a time-invariant transfer function $C(z,\bar{\rho})$ parametrized by the parameter vector $\bar{\rho}$, the feed-forward controller $G_{FF}$ has the transfer function $G_{FF}(z,\bar{\sigma})$ parametrized by the parameter vector $\bar{\sigma}$, and the synchronization controller H has the transfer function $H(z,\bar{\phi})$ parametrized by the parameter vector $\bar{\phi}$. The feed-forward controller $G_{FF}$ may include a default portion $\hat{G}_{FF}(z)$ and a tuning portion $\Delta G_{FF}(z,\bar{\sigma})$. The default portion is a nominal portion from the design specification, and the tuning portion is for fine-tuning. The synchronization controller H is a target filter that receives data concerning the wafer-stage following-error $w^1(t)$. Disturbance is denoted $d^1(t)$, and noise is denoted $v^1(t)$. The vectors $\bar{\rho},\bar{\sigma},\bar{\phi}$ correspond to respective tuning parameters $\rho, \sigma, \phi$ for the feedback, feed-forward, and synchronization controllers. The reticle-stage force-command $u^1$ and the reticle-stage position $y^1$ in this experiment are each functions of time t and all three parameter vectors $\bar{\rho},\bar{\sigma},\bar{\phi}$.

Figure 9:
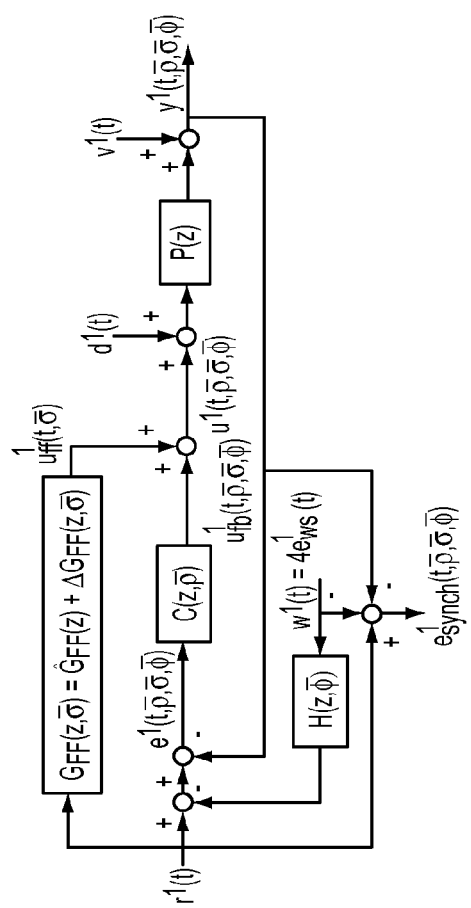
FIG. 9 is a control diagram of a system according to the second embodiment, in which feedback control, feed-forward, and synchronization control of two stages include IFT.

Here, the wafer-stage following-error $e_{ws}^1(t)$ through the target filter $H(z,\bar{\phi})$ is compensated by the reticle-stage feedback controller $C(z,\bar{\rho})$ as shown in FIG. 9. For notational simplicity, in FIG. 9 all the variables pertain to the reticle stage except the wafer-stage error $e_{ws}^1(t)$. Synchronization control is improved by tuning the respective parameters of the controllers.

In a lithography system in which the magnification factor of the imaging-optical system is ¼, the synchronization error $e_{synch}^1(t,\bar{\rho},\bar{\sigma},\bar{\phi})$ is the difference between four times the wafer position $4y_{ws}^1$ and the reticle position $y^1$:

$$e_{synch}^1(t,\bar{\rho},\bar{\sigma},\bar{\phi}) = 4y_{ws}^1(t) - y^1(t,\bar{\rho},\bar{\sigma},\bar{\phi}) \quad (21)$$

Since the reticle-stage trajectory is four times the wafer trajectory, $r^1(t) = 4r_{ws}^1(t)$, the synchronization error on the reticle may be further expressed as below:

$$e_{synch}^1(t, \bar{\rho}, \bar{\sigma}, \bar{\phi}) = 4(r_{ws}^1(t) - e_{ws}^1(t)) - y^1(t, \bar{\rho}, \bar{\sigma}, \bar{\phi}) \quad (22)$$

$$= r^1(t) - w^1(t) - y^1(t, \bar{\rho}, \bar{\sigma}, \bar{\phi})$$

For synchronization control, an exemplary cost-function to be minimized over multiple iterations is:

$$J(\bar{\rho}, \bar{\sigma}, \bar{\phi}) = \quad (23)$$

$$\frac{1}{2N}\left[\sum_{t=1}^{N}(L_y(z)e_{synch}^1(t, \bar{\rho}, \bar{\sigma}, \bar{\phi}))^2 + \lambda\sum_{t=1}^{N}(L_u(z)u_{fb}^1(t, \bar{\rho}, \bar{\sigma}, \bar{\phi}))^2\right]$$

in which t is time; $e_{synch}^1(t,\bar{\rho},\bar{\sigma},\bar{\phi})$ is the synchronization error, on the reticle, of the position of the wafer stage versus the position of the reticle stage; $L_y(z)$ and $L_u(z)$ are weighting factors for the synchronization error $e_{synch}^1$ and feedback control $u_{fb}^1$, respectively; N is number of samples or data points; and $\lambda$ is the scaling factor between the costs from synchronization error and feedback control. For tuning of feed-forward and feedback control of a single stage, the same cost-function (Equation (23)) may be used, except that $e^1$ represents the following-error of the particular stage.

As illustrated in FIG. 9, the synchronization controller $H(z, \bar{\phi})$ is applied to the wafer-stage error $w^1(t)$ with the controller's respective parameter vector $\bar{\phi}$ to be tuned. Besides the parameter vector $\bar{\phi}$, other tuning-parameter vectors $\bar{\rho}$ and $\bar{\sigma}$ exist in the reticle feedback controller $C(z,\bar{\rho})$ and the feedforward controller $G_{FF}(z,\bar{\sigma})$ respectively.

A Gauss-Newton gradient-evaluation method can be used to minimize the cost-function $J(\bar{\rho},\bar{\sigma},\bar{\phi})$, with the parameters being updated from iteration i to iteration i+1, as described below. Respective gradients of the parameters $\bar{\rho},\bar{\sigma},\bar{\phi}$ are determined in the following three experiments performed during each iteration. Minimization of the cost-function is based on step size, gradients of the cost-function, and a Hessian matrix.

$$\bar{\rho}_{i+1} = \bar{\rho}_i - \gamma_i R_{\rho,i}^{-1}\left(\frac{\partial J(\bar{\rho}_i, \bar{\sigma}_i, \bar{\phi}_i)}{\partial \bar{\rho}}\right) \quad (24A)$$

$$\bar{\sigma}_{i+1} = \bar{\sigma}_i - \gamma_i R_{\sigma,i}^{-1}\left(\frac{\partial J(\bar{\rho}_i, \bar{\sigma}_i, \bar{\phi}_i)}{\partial \bar{\sigma}}\right) \quad (24B)$$

$$\bar{\phi}_{i+1} = \bar{\phi}_i - \gamma_i R_{\phi,i}^{-1}\left(\frac{\partial J(\bar{\rho}_i, \bar{\sigma}_i, \bar{\phi}_i)}{\partial \bar{\phi}}\right) \quad (24C)$$

where the step size $1 \geq \gamma_i > 0$. The gradients of the cost-function may be calculated as follows:

$$E\left(\frac{\partial J(\bar{\rho}, \bar{\sigma}, \bar{\phi})}{\partial \bar{\rho}}\right) = \quad (25A)$$
$$\frac{1}{N} E\left[\sum_{t=1}^{N}(L_y(z)e_{synch}^1(t,\bar{\rho},\bar{\sigma},\bar{\phi}))\left(L_y(z)\frac{\partial y^1(t,\bar{\rho},\bar{\sigma},\bar{\phi})}{\partial \bar{\rho}}\right) + \lambda \sum_{t=1}^{N}(L_u(z)u_{fb}^1(t,\bar{\rho},\bar{\sigma},\bar{\phi}))\left(L_u(z)\frac{\partial u_{fb}^1(t,\bar{\rho},\bar{\sigma},\bar{\phi})}{\partial \bar{\rho}}\right)\right]$$

$$E\left(\frac{\partial J(\bar{\rho}, \bar{\sigma}, \bar{\phi})}{\partial \bar{\sigma}}\right) = \quad (25B)$$
$$\frac{1}{N} E\left[\sum_{t=1}^{N}(L_y(z)e_{synch}^1(t,\bar{\rho},\bar{\sigma},\bar{\phi}))\left(L_y(z)\frac{\partial y^1(t,\bar{\rho},\bar{\sigma},\bar{\phi})}{\partial \bar{\sigma}}\right) + \lambda \sum_{t=1}^{N}(L_u(z)u_{fb}^1(t,\bar{\rho},\bar{\sigma},\bar{\phi}))\left(L_u(z)\frac{\partial u_{fb}^1(t,\bar{\rho},\bar{\sigma},\bar{\phi})}{\partial \bar{\sigma}}\right)\right]$$

$$E\left(\frac{\partial J(\bar{\rho}, \bar{\sigma}, \bar{\phi})}{\partial \bar{\phi}}\right) = \quad (25C)$$
$$\frac{1}{N} E\left[\sum_{t=1}^{N}(L_y(z)e_{synch}^1(t,\bar{\rho},\bar{\sigma},\bar{\phi}))\left(L_y(z)\frac{\partial y^1(t,\bar{\rho},\bar{\sigma},\bar{\phi})}{\partial \bar{\phi}}\right) + \lambda \sum_{t=1}^{N}(L_u(z)u_{fb}^1(t,\bar{\rho},\bar{\sigma},\bar{\phi}))\left(L_u(z)\frac{\partial u_{fb}^1(t,\bar{\rho},\bar{\sigma},\bar{\phi})}{\partial \bar{\phi}}\right)\right]$$

The Hessian Matrices used for determining the next-step direction in Equations (24A), (24B), and (24C) are approximated as follows:

$$R_{\rho,i} = \frac{1}{N}\sum_{t=1}^{N}\left[E\left(L_y(z)\frac{\partial y^1(t,\bar{\rho},\bar{\sigma},\bar{\phi})}{\partial \bar{\rho}}\right)E\left(L_y(z)\frac{\partial y^1(t,\bar{\rho},\bar{\sigma},\bar{\phi})}{\partial \bar{\rho}}\right)^T + \lambda E\left(L_u(z)\frac{\partial u_{fb}^1(t,\bar{\rho},\bar{\sigma},\bar{\phi})}{\partial \bar{\rho}}\right)E\left(L_u(z)\frac{\partial u_{fb}^1(t,\bar{\rho},\bar{\sigma},\bar{\phi})}{\partial \bar{\rho}}\right)^T\right] \quad (26A)$$

$$R_{\sigma,i} = \frac{1}{N}\sum_{t=1}^{N}\left[E\left(L_y(z)\frac{\partial y^1(t,\bar{\rho},\bar{\sigma},\bar{\phi})}{\partial \bar{\sigma}}\right)E\left(L_y(z)\frac{\partial y^1(t,\bar{\rho},\bar{\sigma},\bar{\phi})}{\partial \bar{\sigma}}\right)^T + \lambda E\left(L_u(z)\frac{\partial u_{fb}^1(t,\bar{\rho},\bar{\sigma},\bar{\phi})}{\partial \bar{\sigma}}\right)E\left(L_u(z)\frac{\partial u_{fb}^1(t,\bar{\rho},\bar{\sigma},\bar{\phi})}{\partial \bar{\sigma}}\right)^T\right] \quad (26B)$$

$$R_{\phi,i} = \frac{1}{N}\sum_{t=1}^{N}\left[E\left(L_y(z)\frac{\partial y^1(t,\bar{\rho},\bar{\sigma},\bar{\phi})}{\partial \bar{\phi}}\right)E\left(L_y(z)\frac{\partial y^1(t,\bar{\rho},\bar{\sigma},\bar{\phi})}{\partial \bar{\phi}}\right)^T + \lambda E\left(L_u(z)\frac{\partial u_{fb}^1(t,\bar{\rho},\bar{\sigma},\bar{\phi})}{\partial \bar{\phi}}\right)E\left(L_u(z)\frac{\partial u_{fb}^1(t,\bar{\rho},\bar{\sigma},\bar{\phi})}{\partial \bar{\phi}}\right)^T\right] \quad (26C)$$

The parameter gradient vectors of output position and feedback force command, $$\frac{\partial y^1}{\partial \bar{\rho}}, \frac{\partial y^1}{\partial \bar{\sigma}}, \frac{\partial y^1}{\partial \bar{\phi}}, \frac{\partial u_{fb}^1}{\partial \bar{\rho}}, \frac{\partial u_{fb}^1}{\partial \bar{\sigma}}, \frac{\partial u_{fb}^1}{\partial \bar{\phi}},$$

in the foregoing gradients and Hessian matrices are measured later, via the gradient filters $$\frac{1}{C}\frac{\partial C}{\partial \bar{\rho}}, \frac{1}{\Delta G_{FF}}\frac{\partial \Delta G_{FF}}{\partial \bar{\sigma}}, \frac{1}{H}\frac{\partial H}{\partial \bar{\phi}},$$

in additional experiments.

Based on the reticle-stage output position in the first experiment, $$y^1(t,\bar{\rho},\bar{\sigma},\bar{\phi}) = \quad (27)$$
$$\frac{P(z)C(z,\bar{\rho})}{1+P(z)C(z,\bar{\rho})}\cdot(r^1(t) - H(z,\bar{\phi})\cdot w^1(t)) + \frac{P(z)G_{FF}(z,\bar{\sigma})}{1+P(z)C(z,\bar{\rho})}\cdot r^1(t)$$

the output gradient with respect to the feedback-control parameters is as follows:

$$\frac{\partial y^1(t,\bar{p},\bar{\sigma},\bar{\phi})}{\partial \bar{p}} = \frac{\partial C(z,\bar{p})}{\partial \bar{p}}\left[\frac{P(z)}{1+P(z)C(z,\bar{p})} - \frac{P(z)^2 C(z,\bar{p})}{(1+P(z)C(z,\bar{p})^2)}\right]. \quad (28)$$

$$(r^1(t) - H(z,\bar{\phi})\cdot w^1(t)) - \frac{\partial C(z,\bar{p})}{\partial \bar{p}} \cdot \frac{P(z)^2 G_{FF}(z,\bar{\sigma})}{(1+P(z)C(z,\bar{p}))^2} \cdot r^1(t)$$

$$= \frac{1}{C(z,\bar{p})}\frac{\partial C(z,\bar{p})}{\partial \bar{p}}\frac{P(z)C(z,\bar{p})}{1+P(z)C(z,\bar{p})} \times$$

$$\left[\begin{array}{c}(r^1(t)-H(z,\bar{\phi})\cdot w^1(t)) \\ -\underbrace{\frac{P(z)C(z,\bar{p})}{1+P(z)C(z,\bar{p})}(r^1(t)-H(z,\bar{\phi})\cdot w^1(t))-\frac{P(z)G_{FF}(z,\bar{\sigma})}{1+P(z)C(z,\bar{p})}r^1(t)}_{-y^1(t,\bar{p},\bar{\sigma},\bar{\phi})}\end{array}\right]$$

$$= \frac{1}{C(z,\bar{p})}\frac{\partial C(z,\bar{p})}{\partial \bar{p}}\frac{P(z)C(z,\bar{p})}{1+P(z)C(z,\bar{p})}\underbrace{(r^1(t)-H(z,\bar{\phi})\cdot w^1(t)-y^1(t))}_{e^1(t,\bar{p},\bar{\sigma},\bar{\phi})}$$

In the gradient-measurement experiment for the feedback controller, the reference and output for the controller can be directly measured as follows:

$$r^2(t,\bar{p},\bar{\sigma},\bar{\phi}) = r^1(t) - H(z,\bar{\phi})\cdot w(t) - y^1(t,\bar{p},\bar{\sigma},\bar{\phi}) = e^1(t,\bar{p},\bar{\sigma},\bar{\phi}) \quad (29)$$

$$y^2(t,\bar{p},\bar{\sigma},\bar{\phi}) = \frac{P(z)C(z,\bar{p})}{1+P(z)C(z,\bar{p})}\cdot r^2(t,\bar{p},\bar{\sigma},\bar{\phi}) \quad (30)$$

According to Equations (28), (29), and (30), the output gradient with respect to feedback-control parameters may be directly measured:

$$\frac{\partial y^1(t,\bar{p},\bar{\sigma},\bar{\phi})}{\partial \bar{p}} = \underbrace{\frac{1}{C(z,\bar{p})}\left(\frac{\partial C(z,\bar{p})}{\partial \bar{p}}\right)}_{\text{gradient filter}}\cdot y^2(t,\bar{p},\bar{\sigma},\bar{\phi}) \quad (31)$$

A derivation of the feedback-control gradient with respect to the feedback parameter starts with the following:

$$u_{fb}^1(t,\bar{p},\bar{\sigma},\bar{\phi}) = C(z,\bar{p})(r^1(t)-H(z,\bar{\phi})\cdot w^1(t)-y^1(t,\bar{p},\bar{\sigma},\bar{\phi})) \quad (32)$$

After some simple manipulations, the feedback-force gradient with respect to feedback-control parameters is derived as follows:

$$\frac{\partial u_{fb}^1(t,\bar{p},\bar{\sigma},\bar{\phi})}{\partial \bar{p}} = \frac{\partial C(z,\bar{p})}{\partial \bar{p}}(r^1(t)-H(z,\bar{\phi})\cdot w(t) - y^1(t,\bar{p},\bar{\sigma},\bar{\phi})) - \quad (33)$$

$$C(z,\bar{p})\frac{\partial y^1(t,\bar{p},\bar{\sigma},\bar{\phi})}{\partial \bar{p}}$$

$$= \frac{\partial C(z,\bar{p})}{\partial \bar{p}}r^2(t,\bar{p},\bar{\sigma},\bar{\phi}) - \frac{\partial C(z,\bar{p})}{\partial \bar{p}}y^2(t,\bar{p},\bar{\sigma},\bar{\phi})$$

$$= \frac{1}{C(z,\bar{p})}\left(\frac{\partial C(z,\bar{p})}{\partial \bar{p}}\right)$$

$$\left[\frac{C(z,\bar{p})\cdot(r^2(t,\bar{p},\bar{\sigma},\bar{\phi}) - y^2(t,\bar{p},\bar{\sigma},\bar{\phi}))}{e^2(t,\bar{p},\bar{\sigma},\bar{\phi})}\right]$$

$$= \underbrace{\frac{1}{C(z,\bar{p})}\left(\frac{\partial C(z,\bar{p})}{\partial \bar{p}}\right)}_{\text{gradient filter}}\cdot u_{fb}^2(t,\bar{p},\bar{\sigma},\bar{\phi})$$

Based on Equations (29), (30), (31), and (32), the gradient-measurement experiment with respect to the feedback parameters is described below.

Figure 10:
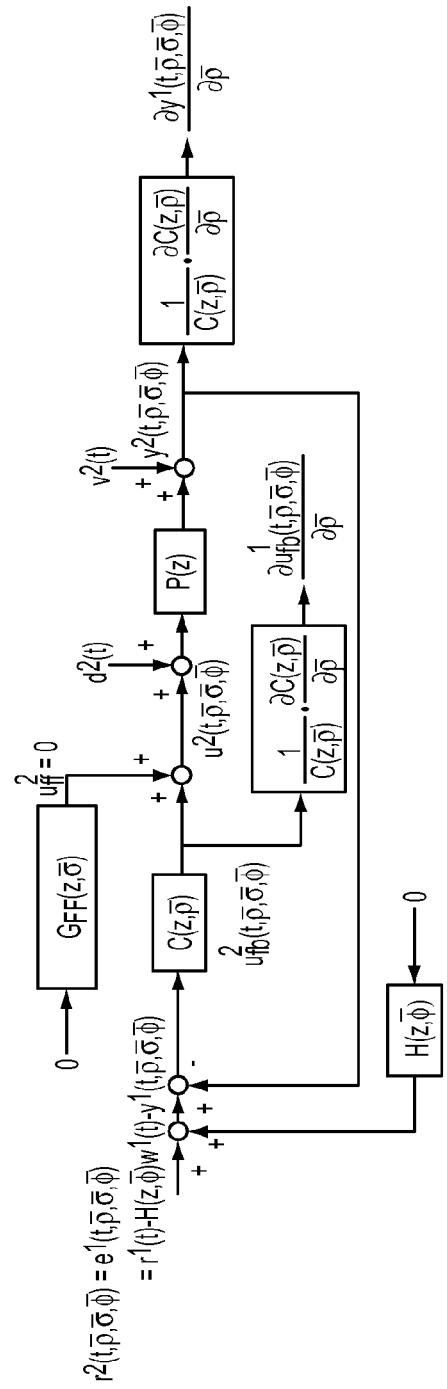
FIG. 10 is a control diagram of a gradient evaluation with respect to feedback parameters, performed by the IFT aspect of the system of the second embodiment.

In the second experiment gradient measurements are obtained with respect to the feedback-control parameters $\bar{p}$. The synchronization error $e^1(t,\bar{p},\bar{\sigma},\bar{\phi})$ obtained in the first experiment is used as the reticle-stage reference $r^2(t)$ in this second experiment (i.e., $r^2(t)=e^1(t,\bar{p},\bar{\sigma},\bar{\phi})$), as shown in FIG. 10. Meanwhile, inputs to the feed-forward controller $G_{FF}(z,\bar{\sigma})$ and the synchronization controller $H(z,\bar{\phi})$ are zero, effectively turning off these controllers (consequently, $u_{FF}^2=0$). This leaves only the feedback parameters $\bar{p}$ to be evaluated in this experiment. The parameter is evaluated by routing the force-command $u_{fb}^2(t,\bar{p},\bar{\sigma},\bar{\phi})$ and reticle-stage position $y^2(t,\bar{p},\bar{\sigma},\bar{\phi})$ through respective gradient filters $$\frac{1}{C(z,\bar{p})}\cdot\frac{\partial C(z,\bar{p})}{\partial \bar{p}}.$$

Outputs from the gradient filters are the respective gradients $$\left(\frac{\partial u_{fb}^1(t,\bar{p},\bar{\sigma},\bar{\phi})}{\partial \bar{p}}\right),\left(\frac{\partial y^1(t,\bar{p},\bar{\sigma},\bar{\phi})}{\partial \bar{p}}\right).$$

To avoid an excessive excitation force in the associated gradient experiment, the feed-forward control has been separated into two portions. The two portions are a default portion $\hat{G}_{FF}(z)$ with fixed parameters and a delta portion $\Delta G_{FF}(z,\bar{\sigma})$ of which the parameters are to be tuned:

$$G_{FF}(z,\bar{\sigma}) = \hat{G}_{FF}(z) + \Delta G_{FF}(z,\bar{\sigma}) \quad (34)$$

Based on the reticle-stage output position in the first experiment, $$y^1(t,\bar{p},\bar{\sigma},\bar{\phi}) = \frac{P(z)C(z,\bar{p})}{1+P(z)C(z,\bar{p})}\cdot(r^1(t)-H(z,\bar{\phi})\cdot w^1(t)) + \quad (35)$$

$$\frac{P(z)(\hat{G}_{FF}(z)+\Delta G_{FF}(z,\bar{\sigma}))}{1+P(z)C(z,\bar{p})}\cdot r^1(t)$$

the output gradient with respect to the feed-forward control parameters is:

$$\frac{\partial y^1(t,\bar{p},\bar{\sigma},\bar{\phi})}{\partial \bar{p}} = \frac{\partial \Delta G_{FF}(z,\bar{\sigma})}{\partial \bar{\sigma}}\cdot\frac{P(z)}{1+P(z)C(z,\bar{p})}r^1(t) \quad (36)$$

-continued $$= \underbrace{\frac{1}{\Delta G_{FF}(z,\overline{\sigma})} \left( \frac{\partial \Delta G_{FF}(z,\overline{\sigma})}{\partial \overline{\sigma}} \right)}_{\text{gradient filter}}.$$

$$\underbrace{\frac{P(z)}{1+P(z)C(z,\overline{p})} \cdot \Delta G_{FF}(z,\overline{\sigma}) \cdot r^1(t)}_{u_{\!f\!f}^3(t,\overline{\sigma})}$$

$$= \underbrace{\frac{1}{\Delta G_{FF}(z,\overline{\sigma})} \frac{\partial \Delta G_{FF}(z,\overline{\sigma})}{\partial \overline{\sigma}}}_{\text{gradient filter}} \cdot y^3(t,\overline{p},\overline{\sigma})$$

Similarly, based on the feedback-control force in the first experiment:

$$u_{fb}^1(t,\overline{p},\overline{\sigma},\overline{\phi}) = C(z,\overline{p})(r^1(t) - H(z,\overline{\phi}) \cdot w^1(t) - y^1(t,\overline{p},\overline{\sigma},\overline{\phi})), \quad (37)$$

the associated feedback-control gradient with respect to the feed-forward control parameters is:

$$\frac{u_{fb}^1(t,\overline{p},\overline{\sigma},\overline{\phi})}{\partial \overline{\sigma}} = -C(z,\overline{p}) \frac{\partial y^1(t,\overline{p},\overline{\sigma},\overline{\phi})}{\partial \overline{\sigma}} \quad (38)$$

With Equation (36), the output gradient (Equation (38)) may be further expressed as follows:

$$\frac{u_{fb}^1(t,\overline{p},\overline{\sigma},\overline{\phi})}{\partial \overline{\sigma}} = \frac{1}{\Delta G_{FF}(z,\overline{\sigma})} \frac{\partial \Delta G_{FF}(z,\overline{\sigma})}{\partial \overline{\sigma}} \cdot \quad (39)$$

$$\left( \frac{-P(z)C(z,\overline{p})}{1+P(z)C(z,\overline{p})} \cdot \frac{\Delta G_{FF}(z,\overline{\sigma}) \cdot r^1(t)}{u_{fb}^3(t,\overline{\sigma})} \right)$$

$$= \underbrace{\frac{1}{\Delta G_{FF}(z,\overline{\sigma})} \frac{\partial \Delta G_{FF}(z,\overline{\sigma})}{\partial \overline{\sigma}}}_{\text{gradient filter}} \cdot u_{fb}^3(t,\overline{p},\overline{\sigma})$$

Figure 11:
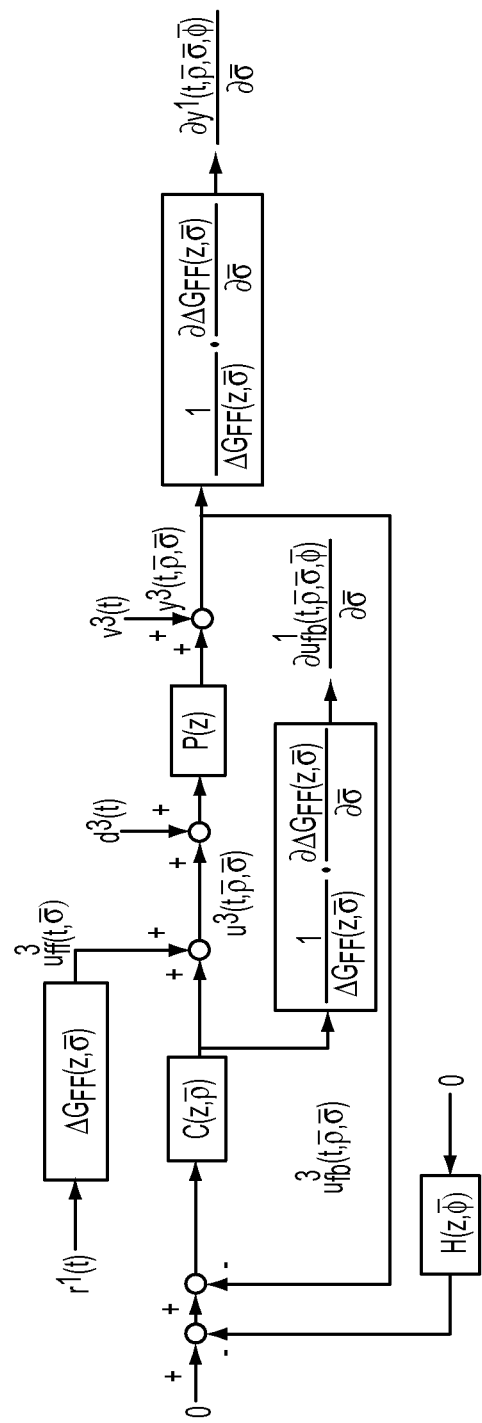
FIG. 11 is a control diagram of a gradient evaluation with respect to feed-forward parameters, performed by the IFT aspect of the system of the second embodiment.

The second experiment provided a gradient measurement of the feedback parameters $\overline{p}$, but the remaining parameters $\overline{\sigma}$, $\overline{\phi}$ still require gradient measurements. Hence, each iteration in this instance involves two more experiments. In the third experiment, gradient measurements are obtained with respect to the feed-forward parameters $\overline{\sigma}$. Referring to FIG. 11, the reticle stage is regulated at the current position ($r^1(t)=0$) without synchronization control (i.e., input to $H(z,\overline{\phi})$ is zero), while the input to the delta feed-forward controller $\Delta G_{FF}(z,\overline{\sigma})$ is the same trajectory $r^1(t)$ used in the first experiment.

Based on the reticle-stage output position in the first experiment:

$$y^1(t,\overline{p},\overline{\sigma},\overline{\phi}) = \quad (40)$$

$$\frac{P(z)C(z,\overline{p})}{1+P(z)C(z,\overline{p})} \cdot (r^1(t) - H(z,\overline{\phi}) \cdot w^1(t)) + \frac{P(z)(G_{FF}(z,\overline{\sigma}))}{1+P(z)C(z,\overline{p})} \cdot r^1(t),$$

the output gradient with respect to the target filter parameters is:

$$\frac{\partial y^1(t,\overline{p},\overline{\sigma},\overline{\phi})}{\partial \overline{\phi}} = \frac{\partial H(z,\overline{\phi})}{\partial \overline{\phi}} \cdot \frac{P(z)C(z,\overline{p})}{1+P(z)C(z,\overline{p})} \cdot (-w^1(t)) \quad (41)$$

$$= \underbrace{\frac{1}{H(z,\overline{\phi})} \frac{\partial H(z,\overline{\phi})}{\partial \overline{\phi}}}_{\text{gradient filter}} \cdot \frac{P(z)C(z,\overline{p})}{1+P(z)C(z,\overline{p})} \cdot$$

$$\left( \underbrace{-H(z,\overline{\phi})' \cdot w^1(t)}_{\text{filtered ws error}} \right)$$

$$= \underbrace{\frac{1}{H(z,\overline{\phi})} \frac{\partial H(z,\overline{\phi})}{\partial \overline{\phi}}}_{\text{gradient filter}} \cdot y^4(t,\overline{p},\overline{\phi})$$

Similarly, based on the feedback-control force in the first experiment:

$$u_{fb}^1(t,\overline{p},\overline{\sigma},\overline{\phi}) = C(z,\overline{p})(r^1(t) - H(z,\overline{\phi}) \cdot w^1(t) - y^1(t,\overline{p},\overline{\sigma},\overline{\phi})), \quad (42)$$

the associated feedback-control gradient with respect to target filter parameters is:

$$\frac{u_{fb}^1(t,\overline{p},\overline{\sigma},\overline{\phi})}{\partial \overline{\sigma}} = -C(z,\overline{p}) \left( \frac{\partial H(z,\overline{\phi})}{\partial \overline{\phi}} \cdot w^1(t) + \frac{\partial y^1(t,\overline{p},\overline{\sigma},\overline{\phi})}{\partial \overline{\phi}} \right) \quad (43)$$

With Equation (41), the feedback-control gradient (Equation (43)), may be further expressed as below:

$$\frac{u_{fb}^1(t,\overline{p},\overline{\sigma},\overline{\phi})}{\partial \overline{\phi}} = -C(z,\overline{p}) \left( \frac{\partial H(z,\overline{\phi})}{\partial \overline{\phi}} \cdot w^1(t) - \right. \quad (44)$$

$$\left. \frac{\partial H(z,\overline{\phi})}{\partial \overline{\phi}} \cdot \frac{P(z)C(z,\overline{p})}{1+P(z)C(z,\overline{p})} \cdot w^1(t) \right)$$

$$= \frac{\partial H(z,\overline{\phi})}{\partial \overline{\phi}} \cdot \frac{C(z,\overline{p})}{1+P(z)C(z,\overline{p})} \cdot (-w^1(t))$$

$$= \underbrace{\frac{1}{H(z,\overline{\phi})} \frac{\partial H(z,\overline{\phi})}{\partial \overline{\phi}}}_{\text{gradient filter}} \cdot \frac{C(z,\overline{p})}{1+P(z)C(z,\overline{p})} \cdot$$

$$\left( \underbrace{-H(z,\overline{\phi}) \cdot w^1(t)}_{\text{filtered ws error}} \right)$$

$$= \underbrace{\frac{1}{H(z,\overline{\phi})} \frac{\partial H(z,\overline{\phi})}{\partial \overline{\phi}}}_{\text{gradient filter}} \cdot u_{fb}^4(t,\overline{p},\overline{\phi})$$

Figure 12:
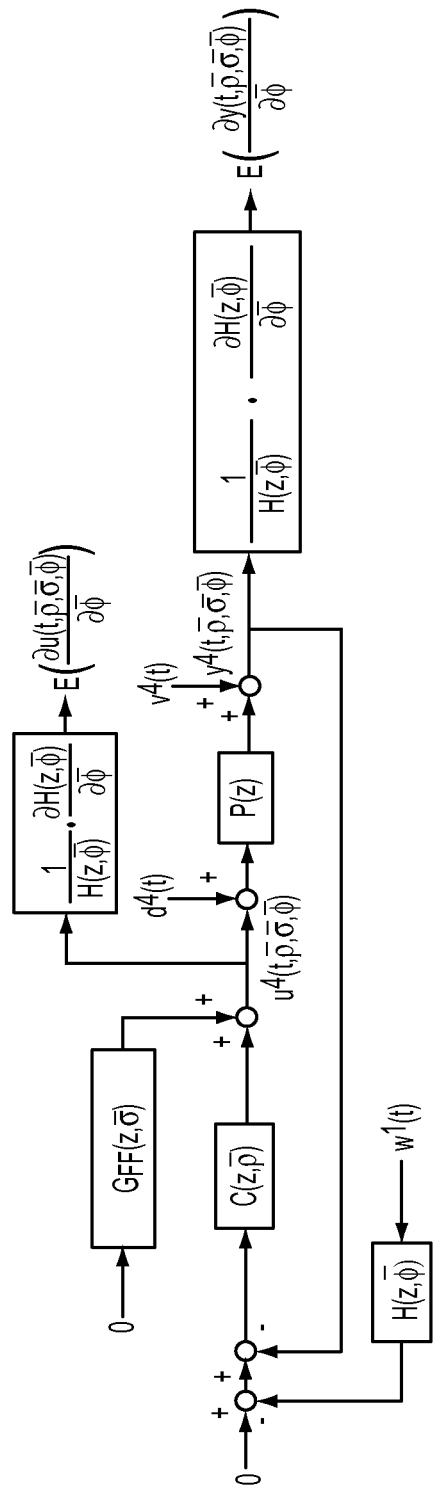
FIG. 12 is a control diagram of a gradient evaluation with respect to synchronization parameters, performed by the IFT aspect of the system of the second embodiment.
Figure 13A:
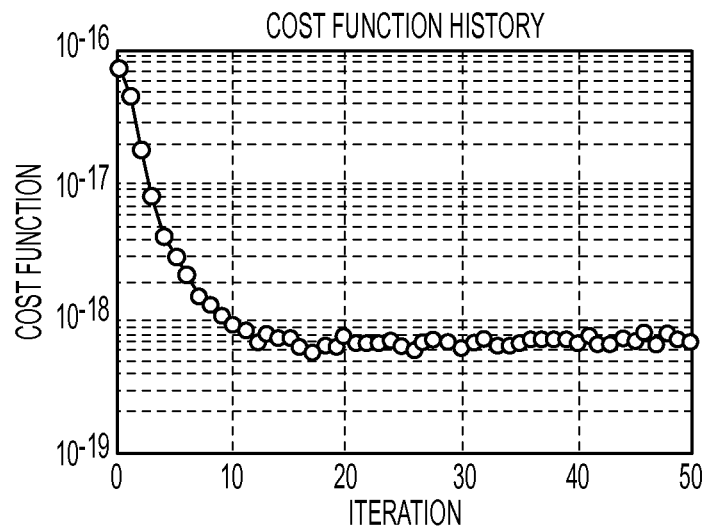
FIGS. 13(A), 13(B), 13(C), 13(D), and 13(E) are plots of cost function, AFC frequency, AFC damping ratio, shaping notch frequency, and shaping notch damping ratio versus iteration number, respectively, obtained in Example 2.
Figure 13B:
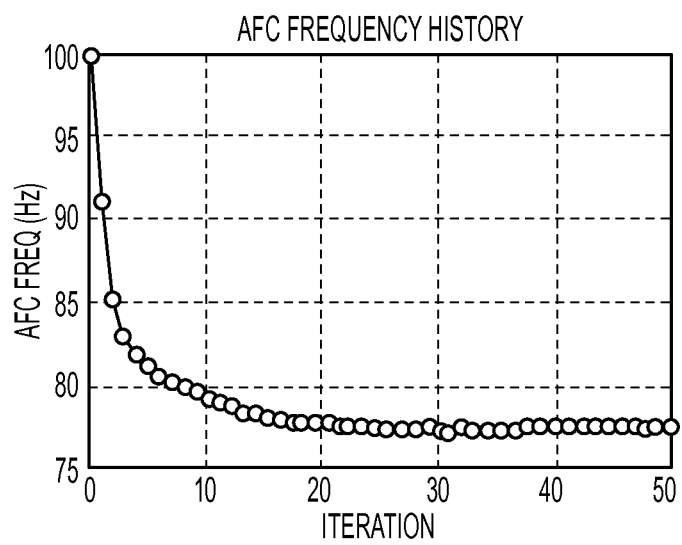
Figure 13C:
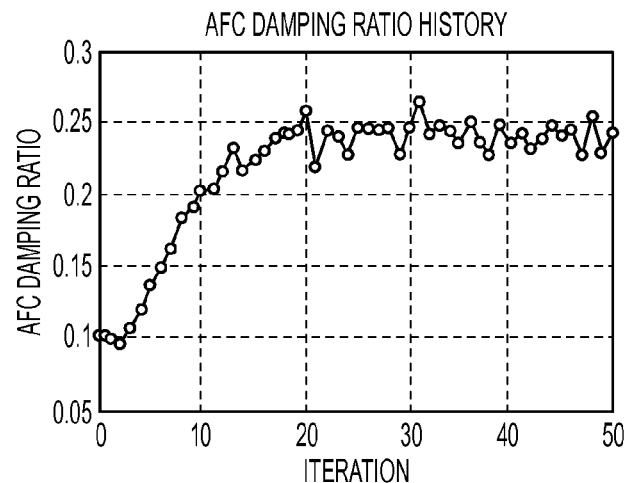
Figure 13D:
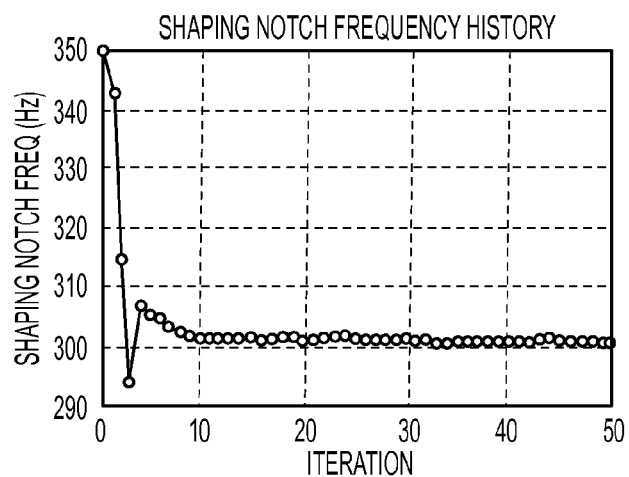
Figure 13E:
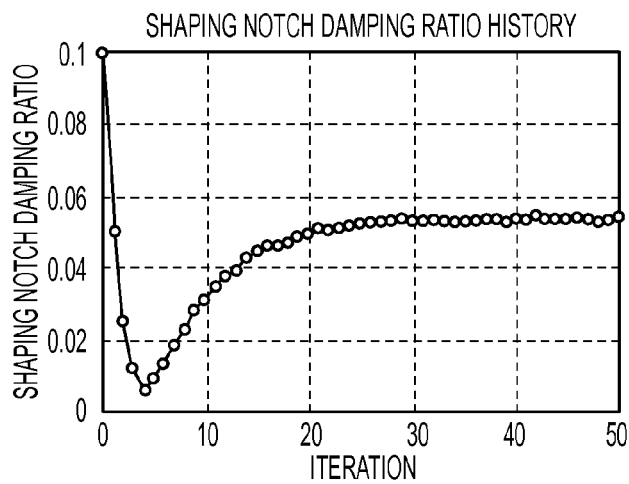

In the fourth experiment, gradient measurements are obtained with respect to the synchronization filter parameters $\overline{\phi}$. Referring to FIG. 12, the wafer-stage error $w^1(t)$ obtained in the first experiment is used as the input to the synchronization controller $H(z,\overline{\phi})$ while the reticle stage is regulated at the current position (i.e., $r(t)=0$). In this control scheme the gradient filters $$\frac{1}{H(z,\overline{\phi})} \cdot \frac{\partial H(z,\overline{\phi})}{\partial \overline{\phi}}$$

provide respective outputs $$\left( \frac{\partial u_{fb}^1(t,\overline{p},\overline{\sigma},\overline{\phi})}{\partial \overline{\phi}} \right), \left( \frac{\partial y^1(t,\overline{p},\overline{\sigma},\overline{\phi})}{\partial \overline{\phi}} \right).$$

The gradient filter used in each of experiments 2-4 is actually a vector of filters:

$$\frac{1}{C(z,\bar{p})}\frac{\partial C(z,\bar{p})}{\partial \bar{p}} = \quad (45A)$$

$$\left[\frac{1}{C(z,\bar{p})}\frac{\partial C(z,\bar{p})}{\partial \rho_1}, \frac{1}{C(z,\bar{p})}\frac{\partial C(z,\bar{p})}{\partial \rho_2}, \cdots, \frac{1}{C(z,\bar{p})}\frac{\partial C(z,\bar{p})}{\partial \rho_{n_\rho}}\right]^T$$

$$\frac{1}{\Delta G_{FF}(z,\bar{\sigma})}\frac{\partial \Delta G_{FF}(z,\bar{\sigma})}{\partial \bar{\sigma}} = \left[\frac{1}{\Delta G_{FF}(z,\bar{\sigma})}\frac{\partial \Delta G_{FF}(z,\bar{\sigma})}{\partial \sigma_1}, \right. \quad (45B)$$

$$\left.\frac{1}{\Delta G_{FF}(z,\bar{\sigma})}\frac{\partial \Delta G_{FF}(z,\bar{\sigma})}{\partial \sigma_2}, \cdots, \frac{1}{\Delta G_{FF}(z,\bar{\sigma})}\frac{\partial \Delta G_{FF}(z,\bar{\sigma})}{\partial \sigma_{n_\sigma}}\right]^T; \text{ and}$$

$$\frac{1}{H(z,\bar{\phi})}\frac{\partial H(z,\bar{\phi})}{\partial \bar{\phi}} = \quad (45C)$$

$$\left[\frac{1}{H(z,\bar{\phi})}\frac{\partial H(z,\bar{\phi})}{\partial \phi_1}, \frac{1}{H(z,\bar{\phi})}\frac{\partial H(z,\bar{\phi})}{\partial \phi_2}, \cdots, \frac{1}{H(z,\bar{\phi})}\frac{\partial H(z,\bar{\phi})}{\partial \phi_{n_\phi}}\right]^T$$

A list of control filters is provided in Table 1, above. In each iteration of IFT the experiments 1-4 are executed to evaluate the cost-function and the associated gradients, to update the controller parameters. The iterations are continued until the parameters converge or the terminating condition is met. Updating of the parameters $\bar{\rho},\bar{\sigma},\bar{\phi}$ from iteration i to iteration i+1 depends upon the step size $\gamma$, the respective gradients of the cost function, and the respective Hessian matrices R, as discussed above.

Example 2

IFT Application to Synchronization Control

For simplicity in this example, it is assumed that the reticle-stage feed-forward control is well-tuned beforehand. Here, a reticle-stage AFC filter and a target notch filter attenuate the wafer-stage following-error vibrations at approximately 80 Hz and 300 Hz, respectively. The simulation is performed in the discrete time domain with a sample period of $96 \times 10^{-6}$ second. Broad-band noise ($\pm 1$ nm) is added to both the reticle-stage and wafer-stage error data.

A two-shot trajectory was used to evaluate the cost-function, the averaged mean square of the synchronization error of two exposures:

$$J(\bar{p}) = \frac{1}{2}\sum_{k=1}^{2}\frac{1}{2N_k}\left[\sum_{t=1}^{N_k}(e^1_{synch}(t,\bar{p},\bar{\phi}))^2 + \lambda(u^1_{fb}(t,\bar{p},\bar{\phi}))^2\right]_{shot\ \#k}$$

and $$\lambda = 0.$$

Experiment 2 of the IFT was a gradient evaluation for the reticle-stage AFC filter parameters. The reticle-stage AFC filter used the same frequency in the numerator and denominator terms, with a fixed ratio $r_a$ ($=1\times 10^{-6}$ here) between their corresponding damping ratios. Hence, only two terms, $w_a$ and $d_a$, were tuned. The transfer functions for the AFC filter and the associated gradient filters are listed below.

AFC filter: $G_{AFC}(s,w_a,d_a) = \dfrac{\dfrac{s^2}{w_a^2} + 2d_a\dfrac{s}{w_a} + 1}{\dfrac{s^2}{w_a^2} + 2r_a d_a\dfrac{s}{w_a} + 1}$ AFC frequency-gradient filter:

$$\frac{1}{G_{AFC}}\frac{\partial G_{AFC}}{\partial w_a} = \frac{-2\dfrac{s^2}{w_a^3} - 2d_a\dfrac{s}{w_a^2}}{\dfrac{s^2}{w_a^2} + 2d_a\dfrac{s}{w_a} + 1} + \frac{2\dfrac{s^2}{w_a^3} + 2r_a d_a\dfrac{s}{w_a^2}}{\dfrac{s^2}{w_a^2} + 2r_a d_a\dfrac{s}{w_a} + 1}$$

AFC damping-gradient filter:

$$\frac{1}{G_{AFC}}\frac{\partial G_{AFC}}{\partial d_a} = \frac{2\dfrac{s}{w_a}}{\dfrac{s^2}{w_a^2} + 2d_a\dfrac{s}{w_a} + 1} - \frac{2r_a\dfrac{s}{w_a}}{\dfrac{s^2}{w_a^2} + 2r_a d_a\dfrac{s}{w_a} + 1}$$

The reticle-stage error recorded in experiment 1 is used as a reticle-stage reference while both the feed-forward control and filtered wafer-stage input are off.

Experiment 3 was a gradient evaluation for the target notch-filter parameters. For simplicity, the target notch-filter used the same frequency in the numerator and denominator terms, with a fixed ratio $r_n$ ($=1\times 10^{-6}$) between their corresponding damping ratios. Hence, only two terms, $w_n$ and $d_n$, were tuned. The transfer functions for the target notch-filter and associated gradient filters are provided below:

Notch filter:

$$G_{Notch}(s,w_n,d_n) = \dfrac{\dfrac{s^2}{w_n^2} + 2r_n d_n\dfrac{s}{w_n} + 1}{\dfrac{s^2}{w_n^2} + 2d_n\dfrac{s}{w_n} + 1}$$

Notch frequency gradient:

$$\frac{1}{G_{Notch}}\frac{\partial G_{Notch}}{\partial w_n} = \frac{-2\dfrac{s^2}{w_n^3} - 2r_n d_n\dfrac{s}{w_n^2}}{\dfrac{s^2}{w_n^2} + 2r_n d_n\dfrac{s}{w_n} + 1} + \frac{2\dfrac{s^2}{w_n^3} + 2d_n\dfrac{s}{w_n^2}}{\dfrac{s^2}{w_n^2} + 2d_n\dfrac{s}{w_n} + 1}$$

Notch damping gradient:

$$\frac{1}{G_{Notch}}\frac{\partial G_{Notch}}{\partial d_n} = \frac{2r_n\dfrac{s}{w_n}}{\dfrac{s^2}{w_n^2} + 2r_n d_n\dfrac{s}{w_n} + 1} - \frac{2\dfrac{s}{w_n}}{\dfrac{s^2}{w_n^2} + 2d_n\dfrac{s}{w_n} + 1}$$

To estimate the gradient associated with notch-filter parameters, the wafer-stage error obtained in experiment 1 was used as the input for the target notch-filter, while the reticle stage was regulated.

With the evaluated gradients and Hessian matrices, the control parameters were updated with step size $\lambda=0.5$. The AFC and notch filters used here were of positive parameters (in continuous time domain) for stability. A lower bound was set for each parameter. If the parameter value for the next step was out of its lower bound, it was updated as the average of the lower bound and the current step value.

Figure 14:
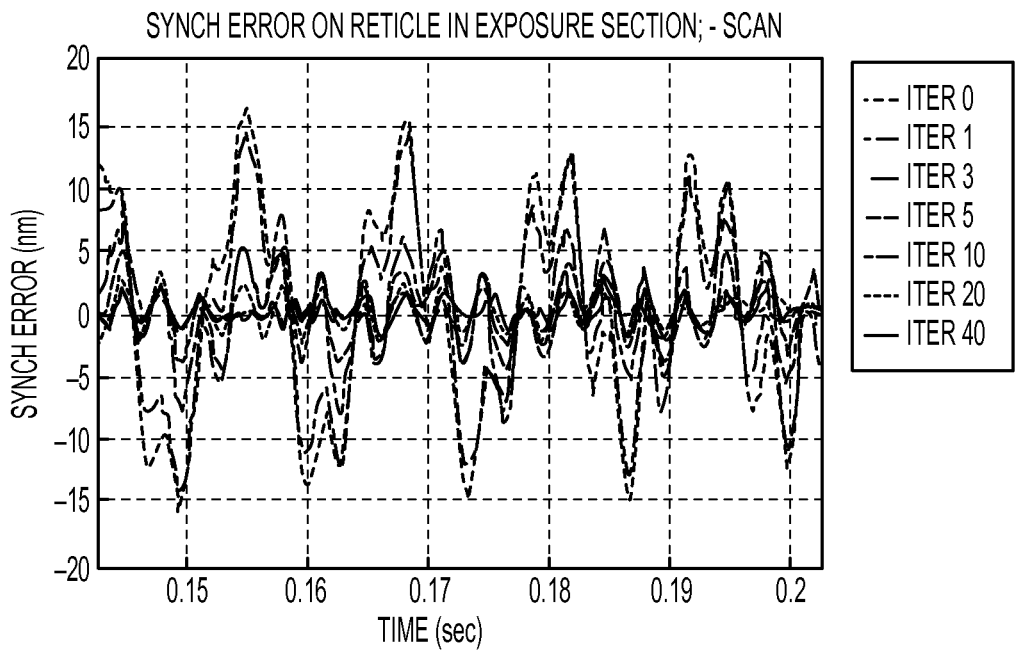
FIG. 14 is a plot of synchronization error in the time-domain at various iterations up to 50, obtained in Example 2.
Figure 15:
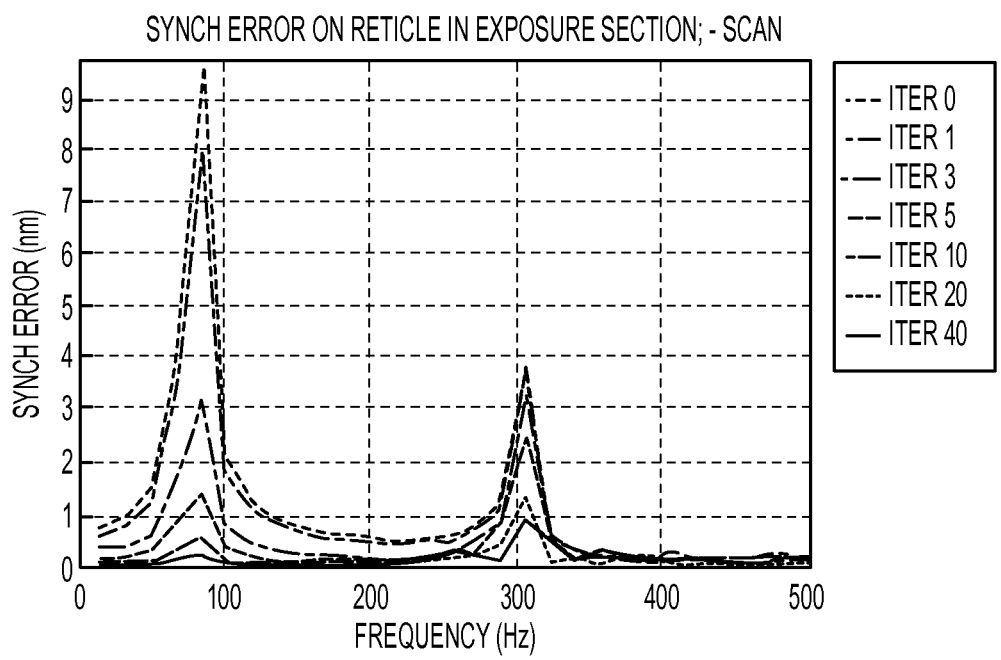
FIG. 15 is a plot of synchronization error frequency-domain (FFT) at various iterations up to 50, obtained in Example 2.
Figure 16:
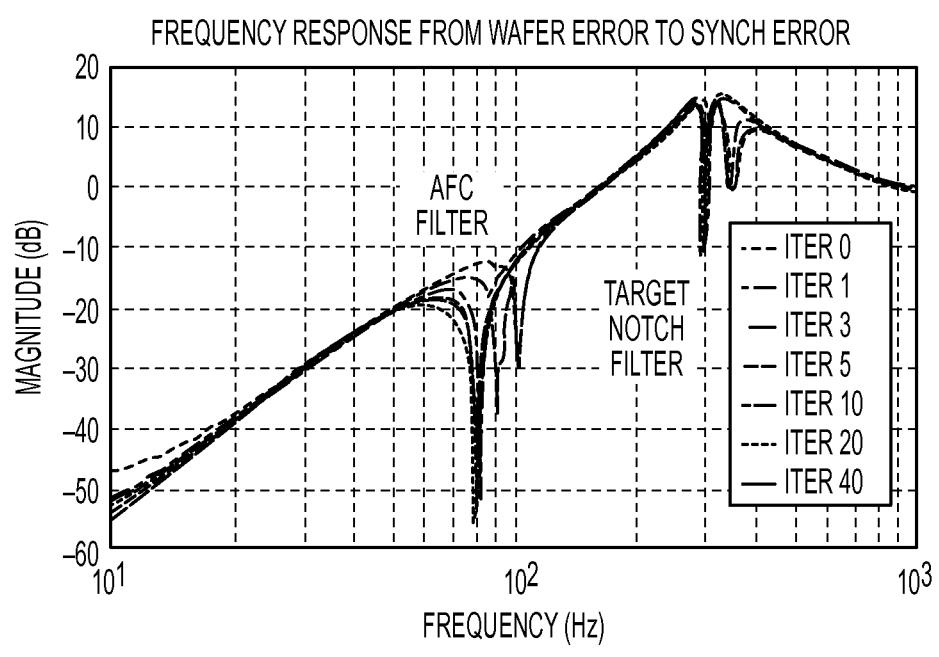
FIG. 16 is the Bode diagram of the frequency response for the transfer function from wafer stage error to synchronization error, obtained in Example 2.

Plots of cost function, AFC frequency, AFC damping history, notch-frequency, and notch-damping with increased iteration are shown in FIGS. 13(A), 13(B), 13(C), 13(D), and 13(E), respectively. FIGS. 14 and 15 are plots of the synchronization error on the reticle in the time-domain and frequency-domain (FFT) for various iterations up to 50. FIG. 16 is a Bode diagram of the frequency response for the transfer function from wafer stage error to synchronization error for various iterations up to 50. These results illustrate that IFT works effectively for achieving optimal minimization of synchronization error.

Third Embodiment

Application of IFT for Feed-Forward Control

In this embodiment, IFT is used for feed-forward control, along with feedback control, of a stage.

Figure 17:
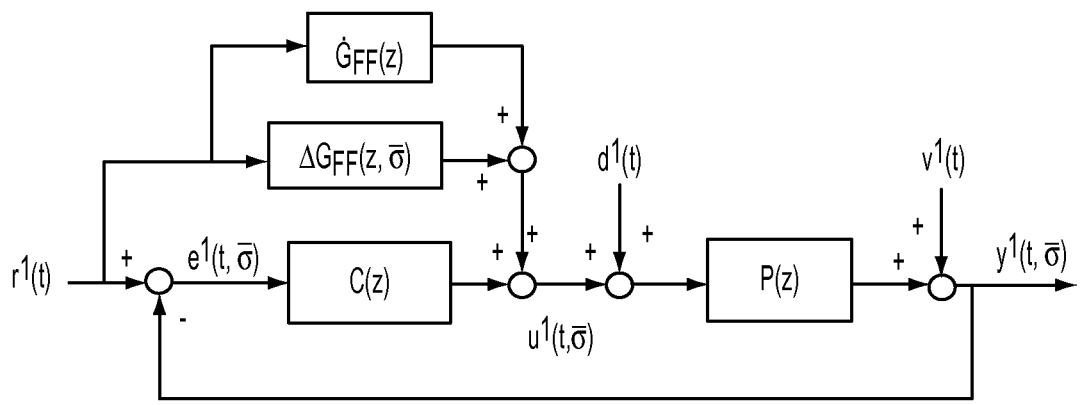
FIG. 17 is a control diagram of a system according to the third embodiment, in which feedback control and feed-forward control of two stages include IFT.

The first experiment is directed to cost-function evaluation. To avoid a high-force excitation during gradient-evaluation experiments (so that the following-error can remain small), the default feed-forward gain, $\hat{G}_{FF}(z)$, which provides the major force, can be fixed. This leaves the delta feed-forward gain $\Delta G_{FF}(z,\bar{\sigma})$, which changes only small amounts, for tuning. In other words, the feed-forward control is separated into the default portion $\hat{G}_{FF}(z)$ and the tuning portion $\Delta G_{FF}(z,\bar{\sigma})$. The control diagram is shown in FIG. 17. For tuning of feed-forward control, the parameter vector $\bar{\sigma}$ of feed-forward control $\hat{G}_{FF}(z,\bar{\sigma})$ is tuned to minimize the cost-function $J(\bar{\sigma})$. The cost-function, expressed below, consists of a following-error $e^1(t,\bar{\sigma}) = r^1(t) - y^1(t,\bar{\sigma})$, in which the "1" superscript denotes experiment 1, and a weighting function $L_y(z)$:

$$J(\bar{\sigma}) = \frac{1}{2N} \sum_{t=1}^{N} (L_y(z) e^1(t, \bar{\sigma}))^2 \qquad (46)$$

The goal is to minimize this cost-function. The Gauss Newton gradient method (i.e., Gauss Newton approximation of the Hessian of $J(\bar{\sigma})$) can be used to minimize the cost-function. Parameter updating from iteration i to iteration i+1 depends on step size γ, the gradient $$\frac{\partial J(\bar{\sigma})}{\partial \bar{\sigma}}$$

of the cost-function, and the Hessian matrix R:

$$\bar{\sigma}_{i+1} = \bar{\sigma}_i - \gamma_i R_{\sigma,i}^{-1} \frac{\partial J(\bar{\sigma}_i)}{\partial \bar{\sigma}} \qquad (47)$$

Desirably, the step size in each iteration is $1 \geq \gamma_i > 0$. The gradients of the cost function are calculated as follows:

$$\frac{\partial J(\bar{\sigma})}{\partial \bar{\sigma}} = \frac{1}{N} \sum_{t=1}^{N} (L_y(z) e^1(t, \bar{\sigma})) \left( -L_y(z) \frac{\partial y^1(t, \bar{\sigma})}{\partial \bar{\sigma}} \right) \qquad (48)$$

and the Hessian matrices (approximate second-order gradients) for the next iteration step in Equation (47) may be approximated as follows:

$$R_{\sigma,i} = \frac{1}{N} \sum_{t=1}^{N} \left( L_y(z) \frac{\partial y^1(t, \bar{\sigma})}{\partial \bar{\sigma}} \right) \left( L_y(z) \frac{\partial y^1(t, \bar{\sigma})}{\partial \bar{\sigma}} \right)^T \qquad (49)$$

A key goal is to define the feed-forward parameter gradient vector of the output position, $$\frac{\partial y^1(t, \bar{\sigma})}{\partial \bar{\sigma}}.$$

This term can be derived as follows. As shown in FIG. 15, the number plant-output position in experiment 1 is controlled by a feedback controller C(z) and the feed-forward controllers $\hat{G}_{FF}(z)$ and $\Delta G_{FF}(z,\bar{\sigma})$:

$$y^1(t) = \underbrace{\frac{P(z)C(t)}{1 + P(z)C(z)} r^1(t)}_{\text{Feed-back}} + \underbrace{\frac{p(z)(\hat{G}_{FF}(z) + \Delta G_{FF}(z, \bar{\sigma}))}{1 + P(z)C(z)} r^1(t)}_{\text{Feed-forward}} \qquad (50)$$

The associated parameter-gradient vector is derived as follows:

$$\frac{\partial y^1(t)}{\partial \bar{\sigma}} = \frac{\partial \Delta G_{FF}(z, \bar{\sigma})}{\partial \bar{\sigma}} \left( \frac{P(z)}{1 + P(z)C(z)} \right) r^1(t) \qquad (51)$$
$$= \frac{1}{\Delta G_{FF}(z, \bar{\sigma})} \left( \frac{\partial \Delta G_{FF}(z, \bar{\sigma})}{\partial \bar{\sigma}} \right) \underbrace{\frac{P(z) \Delta G_{FF}(z, \bar{\sigma})}{1 + P(z)C(z)} r^1(t)}_{y^2(t)}$$

If we define:

$$y^2(t) = \frac{P(z) \Delta G_{FF}(z, \bar{\sigma})}{1 + P(z)C(z)} r^1(t), \qquad (52)$$

then:

$$\frac{\partial y^1(t)}{\partial \bar{\sigma}} = \frac{1}{\Delta G_{FF}(z, \bar{\sigma})} \left( \frac{\partial \Delta G_{FF}(z, \bar{\sigma})}{\partial \bar{\sigma}} \right) \cdot y^2(t) \qquad (53)$$

Based on Equations (52) and (53), the gradient-measurement experiment (experiment 2) is designed as follows, with respect to feed-forward parameters.

Figure 18:
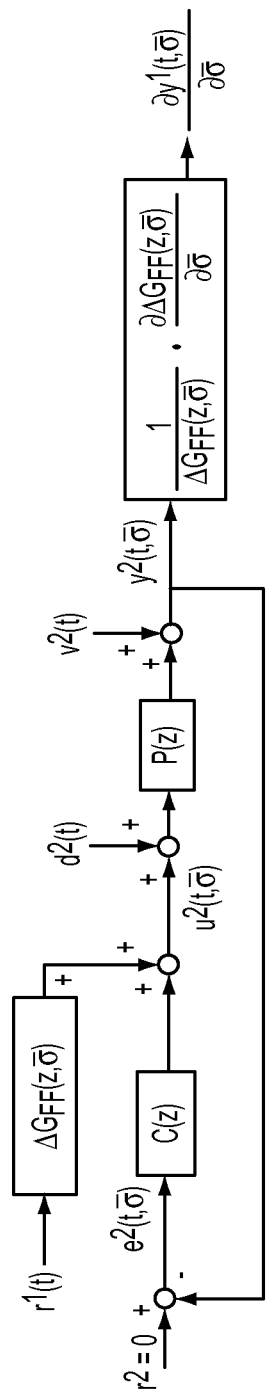
FIG. 18 is a control diagram of a gradient evaluation with respect to feed-forward parameters, performed by the IFT aspect of the system of the third embodiment.

According to Equation (52), the stage position is regulated at an arbitrary set-point $r^2$ (i.e., $r^2=0$), in which the "2" superscript denotes experiment 2. The delta feed-forward control is applied with the same trajectory $r^1(t)$ as in experiment 1. See control diagram of FIG. 18.

The parameter gradient vector $$\frac{\partial y(t, \bar{\sigma})}{\partial \bar{\sigma}}$$

is measured as a filtered output position with gradient filters $$\frac{1}{\Delta G_{FF}(z, \bar{\sigma})} \left( \frac{\partial \Delta G_{FF}(z, \bar{\sigma})}{\partial \bar{\sigma}} \right).$$

where:

$$\frac{\partial \Delta G_{FF}(z, \overline{\sigma})}{\partial \overline{\sigma}} = \qquad (54)$$

$$\left[\frac{\partial \Delta G_{FF}(z, \overline{\sigma})}{\partial \sigma_1} \frac{\partial \Delta G_{FF}(z, \overline{\sigma})}{\partial \sigma_2} \cdots \frac{\partial \Delta G_{FF}(z, \overline{\sigma})}{\partial \sigma_j} \cdots \frac{\partial \Delta G_{FF}(z, \overline{\sigma})}{\partial \sigma_n}\right]^T$$

For a simple trajectory-based delta feed-forward control, $$\Delta G_{FF}(s) = k_{snap} s^4 + k_{jerk} s^3 + k_{acc} s^2 + k_{vel} s + k_{pos} \qquad (55)$$

the gradient filters $$\frac{1}{\Delta G_{FF}(s)} \left(\frac{\partial \Delta G_{FF}(s, \overline{\sigma})}{\partial \overline{\sigma}}\right)$$

are listed in Table 2, below.

TABLE 2

| $\overline{\sigma}$ | $k_{snap}$ | $k_{jerk}$ | $k_{acc}$ | $k_{vel}$ | $k_{pos}$ |
|---|---|---|---|---|---|
| $\frac{1}{\Delta G_{FF}(s)}\left(\frac{\partial \Delta G_{FF}(s, \overline{\sigma})}{\partial \overline{\sigma}}\right)$ | $\frac{s^4}{\Delta G_{FF}(s)}$ | $\frac{s^3}{\Delta G_{FF}(s)}$ | $\frac{s^2}{\Delta G_{FF}(s)}$ | $\frac{s}{\Delta G_{FF}(s)}$ | $\frac{1}{\Delta G_{FF}(s)}$ |

For discrete time implementation, Tustin and zero-order-hold conversion may be applied to the above gradient filters for trajectories with trapezoidal and Euler integrators respectively.

Example 3

IFT Application to Feed-Forward Control Tuning for a Fourth-Order System

This example is a simulation model in which a reticle stage system was used. The simulation was conduced with a discrete-time model. To verify the tuning effectiveness explicitly, the system modeling and timing were carefully treated to provide an analytical optimization solution for feed-forward control. For instance, the plant was a $2^{nd}$ order rigid-body with $2^{nd}$ amplifier dynamics, converted to a discrete-time model using the Tustin-bilinear method:

$$P(s) = \left(\frac{1}{ms^2 + cs + k}\right)\left(\frac{1}{\frac{s^2}{w_1^2} + 2d_1 \frac{s}{w_1} + 1}\right)$$

The trajectory utilized trapezoidal (bilinear) integrators. The trajectory output position was delayed by the same four samples as the system delay. Therefore, the overall acceleration feed-forward gain was expected to be the inverse dynamics of the plant.

$$G_{FF}(s) = \hat{G}_{FF}(s) + \Delta G_{FF}(s) \to P^{-1}(s)$$

$$= (ms^2 + cs + k)\left(\frac{s^2}{w_1^2} + 2d_1 \frac{s}{w_1} + 1\right)$$

$$= \frac{m}{w_1^2} s^4 + \left(\frac{c}{w_1^2} + \frac{2d_1 m}{w_1}\right)s^3 + \left(\frac{k}{w_1^2} + \frac{2d_1 c}{w_1} + m\right)s^2 +$$

-continued $$\left(\frac{2d_1 k}{w_1} + c\right)s + k$$

The feed-forward control gains were separated into two portions, default feed-forward gains and delta feed-forward gains. The same default feed-forward gain was used all the time while tuning the delta feed-forward gains.

Figure 19A:
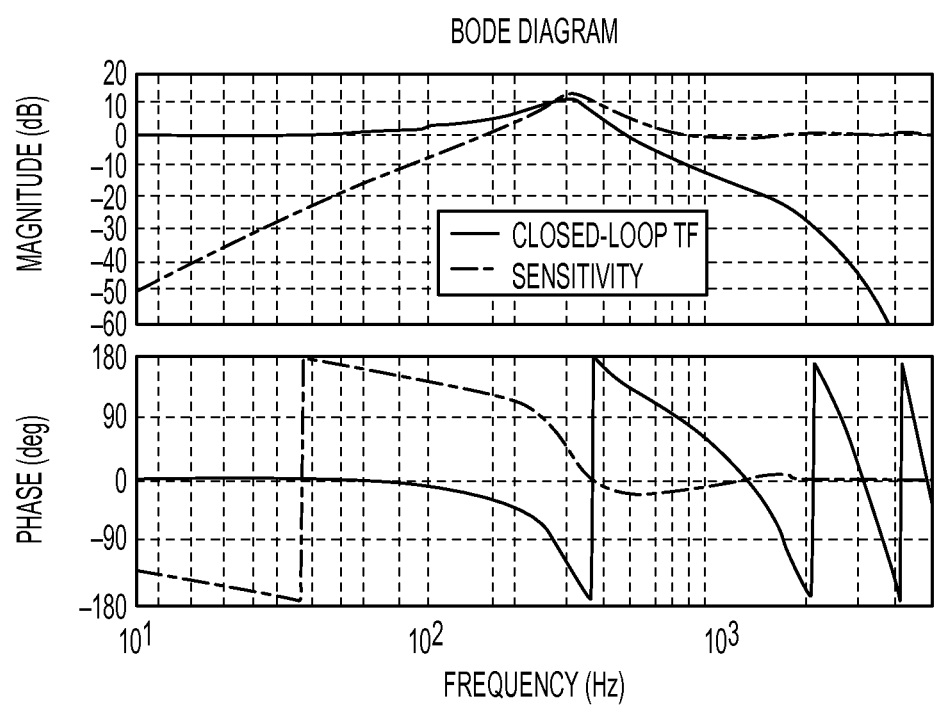
FIG. 19(A) is a Bode diagram of the closed-loop frequency response obtained in Example 3.
Figure 19B:
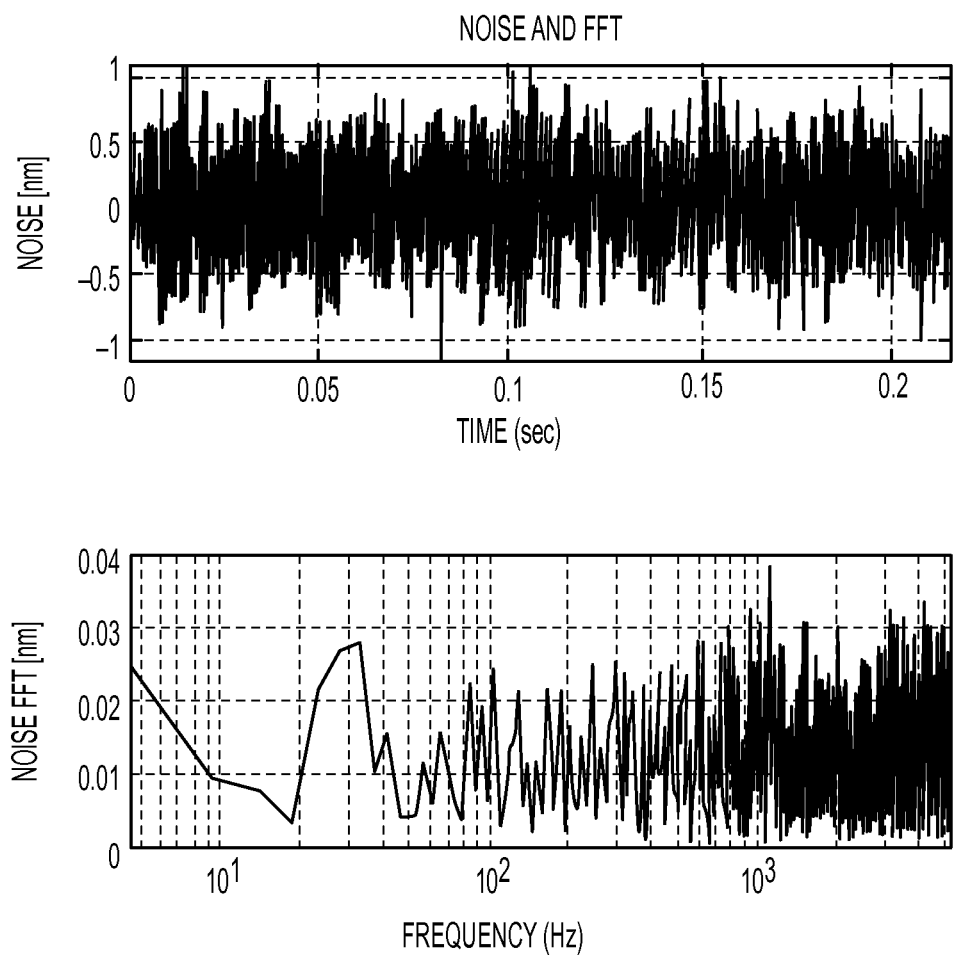
FIG. 19(B) includes a time-domain plot (upper plot) and frequency-domain plot (lower plot) of typical noise added to the stage-position output, in Example 3.

The feed-forward control was roughly tuned to achieve a 270-Hz closed-loop bandwidth (see FIG. 19(A)). To evaluate the tuning effectiveness under a real-world environment, quantization was applied for 0.01 N and 0.3 nm force and sensor resolutions, respectively. White-noise was also added to the stage position (before quantization) with different seed settings for each experiment. A typical noise used in the simulation is plotted in FIG. 19(B).

Figure 19C:
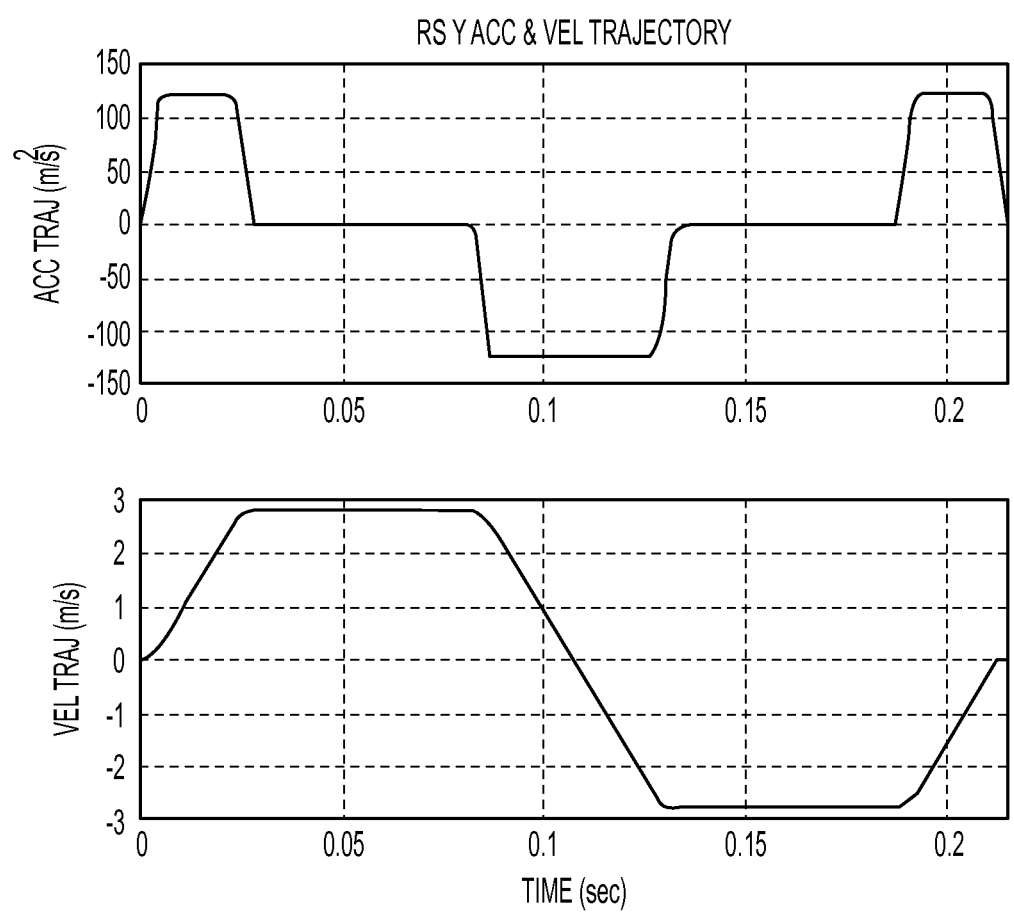
FIG. 19(C) are plots of the reticle-stage y-acceleration (upper plot) and y-velocity (lower plot), in Example 3.
Figure 20A:
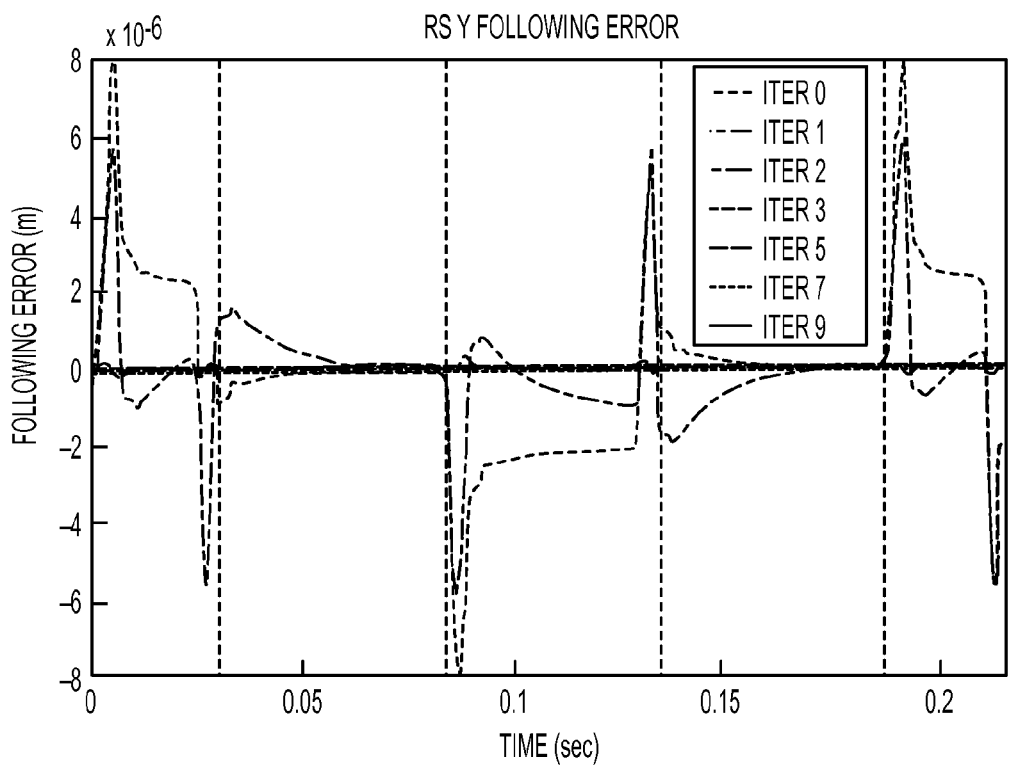
FIGS. 20(A) and 20(B) are plots of following error and "zoomed-in" following error (note respective scales on ordinates) as functions of time, obtained in Example 3.
Figure 20B:
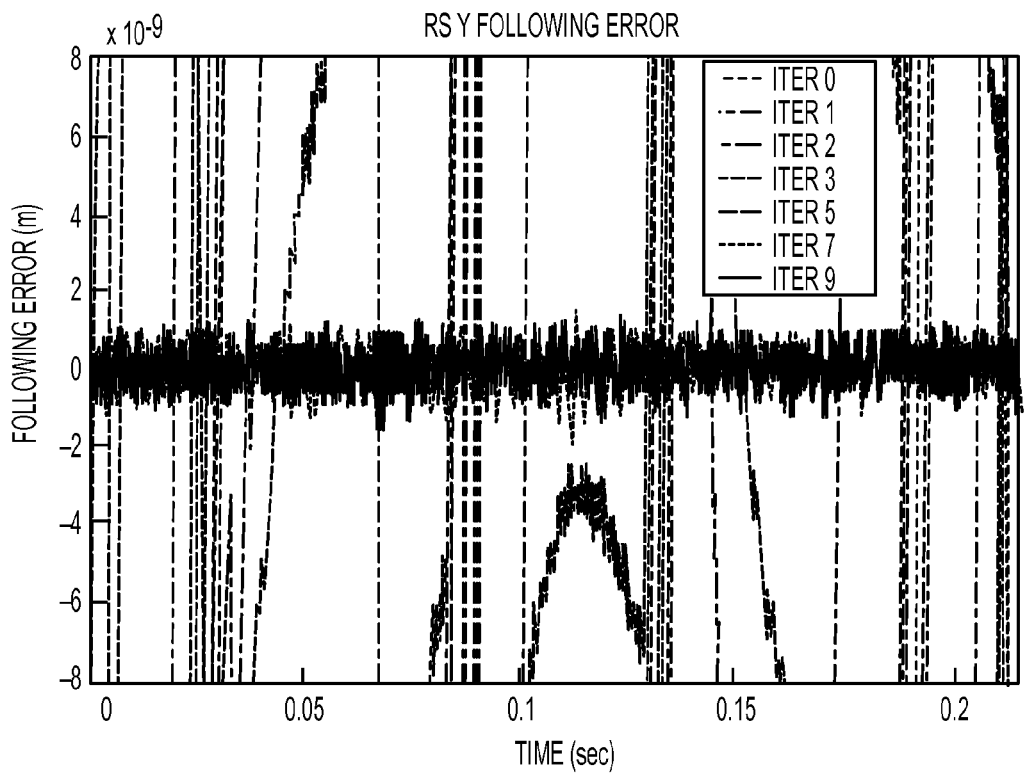
Figure 21A:
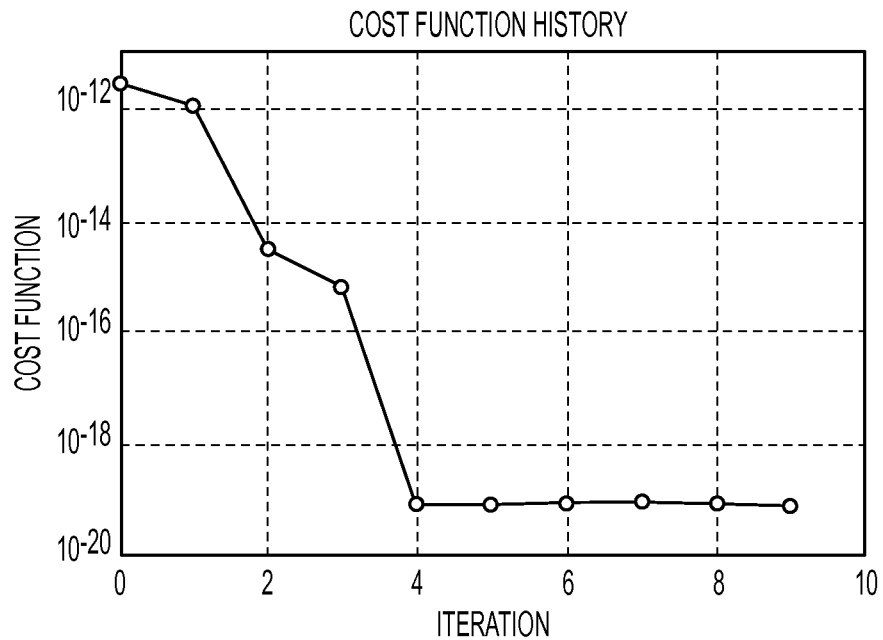
FIGS. 21(A), 21(B), 21(C), 21(D), 21(E), and 21(F) are plots of history versus iteration for cost-function, snap feed-forward gain, jerk feed-forward gain, acceleration feed-forward gain, velocity feed-forward gain, and position feed-forward gain, respectively, obtained in Example 3.
Figure 21B:
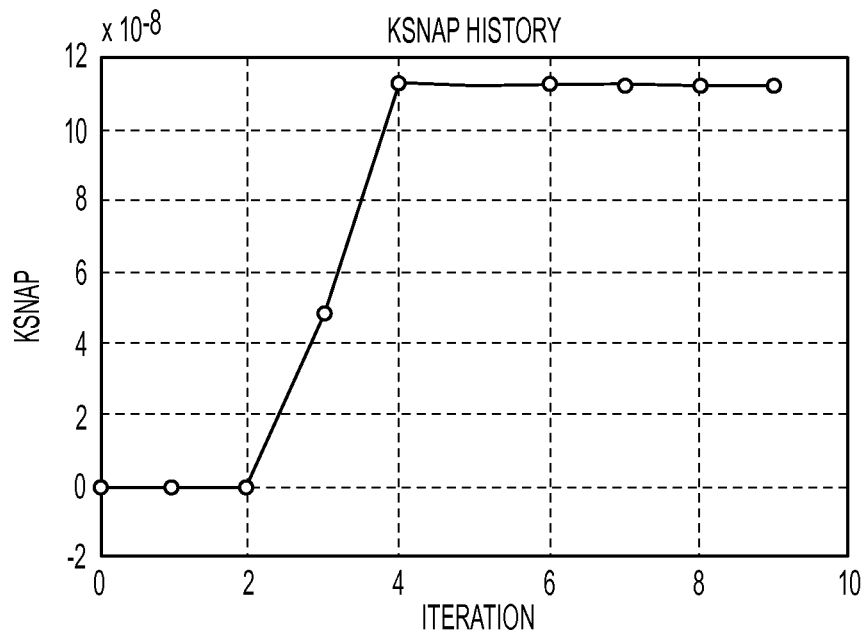
Figure 21C:
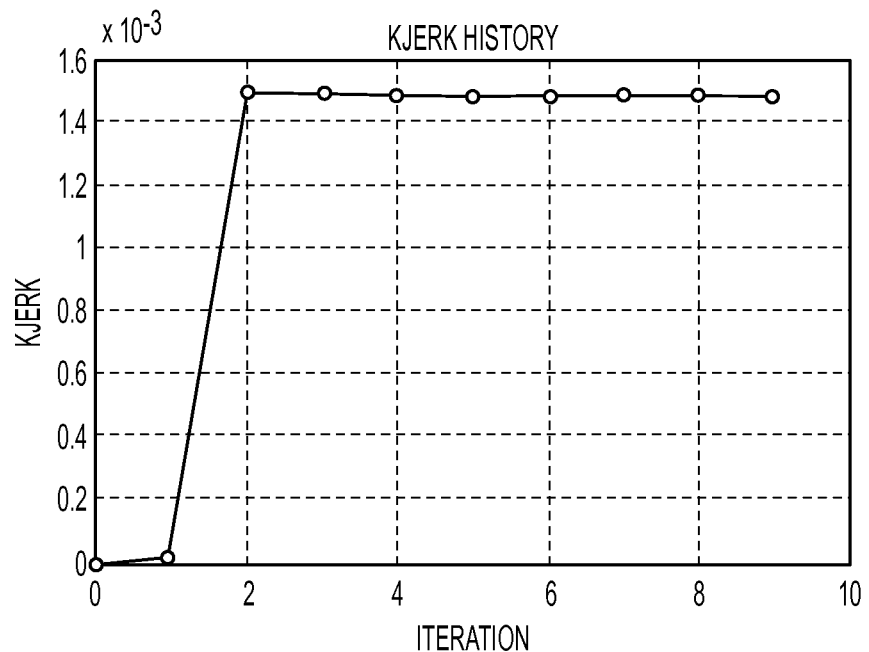
Figure 21D:
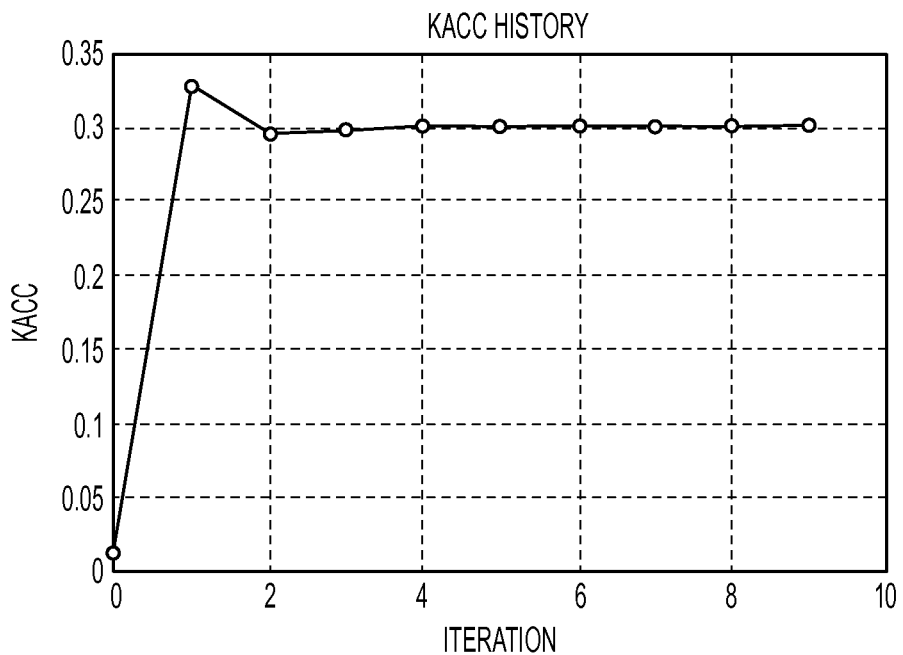
Figure 21E:
Figure 21F:
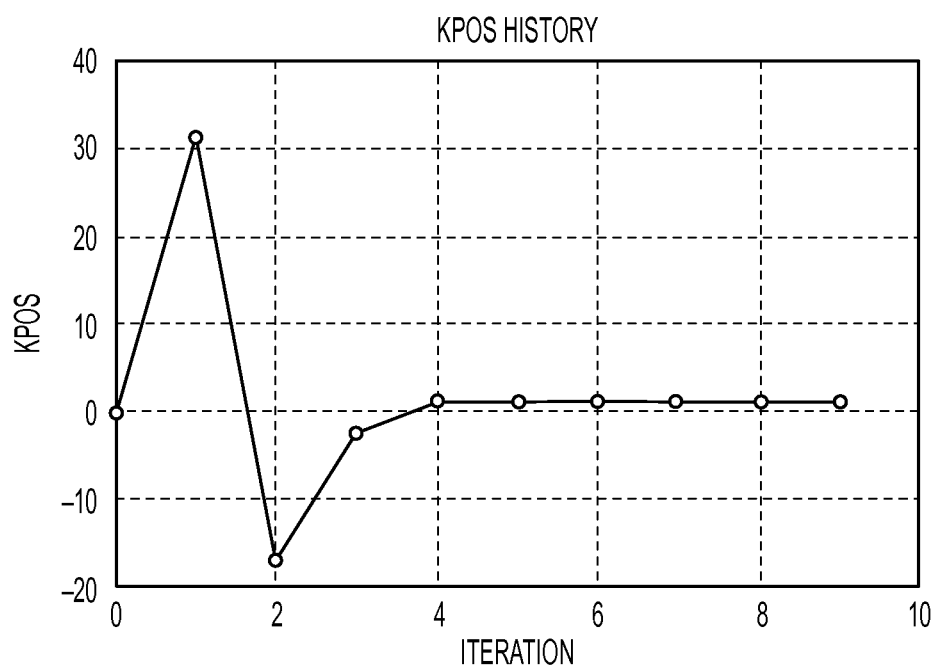

For evaluation of the cost function, the stage was run two "shots" (FIG. 19(C)) at 2.8 m/s scan velocity and 10 g average acceleration with the settling time being 1 ms, the slit size being 5 mm, and the shot length of the wafer stage being 33 mm (33 mm×4 for the reticle stage). The cost-function was the sum of the squared stage following-error for the entire motion, without weighting:

$$J(\overline{\sigma}) = \frac{1}{2N}\sum_{t=1}^{N} (e^1(t, \overline{\sigma}))^2$$

In each iteration, after completing the cost-function evaluation (experiment 1), a gradient-evaluation experiment was executed with the stage position being regulated (with a fixed position setpoint) while applying the delta feed-forward control. With the measured gradient values, the delta feed forward parameters were updated using Equations (47), (48), and (49), which concluded the tuning iteration. The same procedure (experiments 1 and 2) was repeated over multiple iterations with updated delta feed-forward parameters until the tunings converged.

To see the step-size effect, several sets of tunings were executed with various respective step sizes.

Results obtained with a tuning process having an ideal step size ($\gamma_i=1$) for all iterations (i=0, 1, 2, . . . , 9) are shown in FIGS. 20(A)-20(B) and 21(A)-21(F). With this ideal step size, the following-error reduced quickly after the initial iteration (FIGS. 20(A) and 20(B)). The cost-function history (FIG. 21(A)) showed that the optimization process converged after the initial iteration. See FIGS. 21(B)-21(F) for respective gain histories of snap feed-forward, jerk feed-forward, acceleration feed-forward, velocity feed-forward, and position feed-forward, respectively.

With step sizes deviating from $\gamma_i=1$, convergence slowed, but rapid (exponential) convergence was still seen.

Microlithography System

FIG. 1 is a schematic illustration of a precision system, in this embodiment an exposure apparatus 10, embodying features as discussed above. The exposure apparatus 10 includes an apparatus frame 12, an illumination system 14, an optical assembly 16, a reticle-stage assembly 18, a wafer-stage assembly 20, a measurement system 22, one or more sensors 23, and a control system 24. The respective configurations of the components of the exposure apparatus 10 can be varied to suit the design requirements of the exposure apparatus 10.

It will be understood that the "optical assembly" 16 can include optical and mechanical components. But the assembly 16 in other precision system embodiments may not have any optical components. The assembly 16 can be any of various "process assemblies" or process tools relative to which at least one of the stages 18, 20 positions an object being carried by the stage.

The control system 24 utilizes a position-compensation system that improves the accuracy in the control and relative positioning of at least one of the stage assemblies 18, 20. The control system 24 can include multiple controllers, including stage-motion controllers programmed to perform IFT as they iteratively control motion of one or more of the stage assemblies.

The exposure apparatus 10 is useful as a lithography tool that transfers a pattern (not shown) of an integrated circuit or other micro-device from a reticle 26 onto a substrate ("wafer") 28. The exposure apparatus 10 rests on a mounting base 30, e.g., the ground, a base, a floor, or other supporting structure.

There are a number of different types of lithography tools. For example, the exposure apparatus 10 can be used as scanning-type photolithography system that exposes the pattern from the reticle 26 onto the wafer 28 with the reticle 26 and the wafer 28 moving synchronously. In a scanning-type lithography tool, during exposures the reticle 26 is moved perpendicularly to an optical axis of the optical assembly 16 by the reticle-stage assembly 18, and the wafer 28 is moved perpendicularly to the optical axis of the optical assembly 16 by the wafer-stage assembly 20. Meanwhile, scanning of the reticle 26 and the wafer 28 occurs. Synchronous motions of the reticle and wafer are achieved while their respective stage assemblies are being controlled as described above.

Alternatively, the exposure apparatus 10 can be a step-and-repeat type of lithography tool that exposes the wafer 28 while the reticle 26 and the wafer 28 are momentarily stationary. In step-and-repeat exposure, the wafer 28 is in a constant position relative to both the reticle 26 and the optical assembly 16 during exposure of an individual field on the wafer. Between consecutive exposure steps, the wafer 28 is moved using the wafer-stage assembly 20 perpendicularly to the optical axis of the optical assembly 16 to bring the next field of the wafer 28 into position relative to the optical assembly 16 and the reticle 26 for exposure. By repeating this sequence, images of the pattern defined by the reticle 26 are sequentially exposed onto the fields of the wafer 28.

Use of the exposure apparatus 10 provided herein is not limited to a lithography tool for integrated-circuit manufacturing. The exposure apparatus 10, for example, can be used as an LCD photolithography system that exposes a pattern of a liquid-crystal display device onto a rectangular glass plate, for example, or a photolithography system for manufacturing a thin-film magnetic head. Alternatively, the exposure apparatus 10 can be a proximity photolithography system that exposes a pattern from a mask to a substrate with the mask being located close to the substrate without the use of the optical assembly 16.

The apparatus frame 12 is rigid and supports the components of the exposure apparatus 10. The apparatus frame 12 illustrated in FIG. 1 supports the optical assembly 16 and the illumination system 14 above the mounting base 30.

The illumination system 14 includes an illumination source 34 and an illumination-optical assembly 36. The illumination source 34 emits a beam of light energy. The illumination-optical assembly 36 guides the beam of light energy from the illumination source 34 to the optical assembly 16. The beam illuminates selectively different portions of the reticle 26 and exposes the wafer 28. In FIG. 1 the illumination source 34 is illustrated as being supported above the reticle-stage assembly 18. Typically, however, the illumination source 34 is secured to one of the sides of the apparatus frame 12, and the energy beam from the illumination source 34 is directed to above the reticle-stage assembly 18 with the illumination-optical assembly 36.

The illumination source 34 can be a high-pressure mercury lamp (producing, for example, g-line or i-line ultraviolet light), a KrF excimer laser, an ArF excimer laser, or a $F_2$ excimer laser, or an x-ray source. Alternatively, the illumination source 34 can produce a charged-particle beam such as an electron beam. An electron beam can be produced by, for example, a thermionic-emission type lanthanum hexaboride ($LaB_6$) source or a tantalum (Ta) cathode. Furthermore, in the case in which an electron beam is used, either a mask can be used or a pattern can be directly formed on the substrate without using a mask or reticle.

The assembly 16 typically is an optical assembly that, for example, projects and/or focuses the light energy passing through the reticle 26 to the wafer 28. Depending upon the design of the exposure apparatus 10, the image formed by the assembly 16 on the wafer can be magnified or reduced relative to the corresponding pattern on the reticle. Hence, the assembly 16 is not limited to a reduction system. It can alternatively be a 1× or a magnification system.

Whenever far-UV light such as light from an excimer laser is used for exposure, glass materials such as quartz and fluorite that transmit far-UV light can be used in the assembly 16. Whenever exposure using light from an $F_2$ excimer laser, extreme UV, or X-ray source is used, the assembly 16 can be catadioptric or reflective (the reticle desirably is a reflective type). Whenever an electron beam is used, the assembly 16 includes electron optics such as electron lenses and deflectors. The optical path for an extreme UV beam or electron beam should be in a vacuum.

Examples of catadioptric (reflective-refractive) optical systems are discussed in U.S. Pat. Nos. 5,668,672 and 5,835,275. In these cases, the reflecting optical device can be a catadioptric optical system incorporating a beam-splitter and a concave mirror. U.S. Pat. No. 5,689,377 also discusses a catadioptric optical system incorporating a concave mirror, etc., but without a beam-splitter. As far as is permitted by law, the disclosures in these U.S. patents are incorporated herein by reference.

The reticle-stage assembly 18 holds and positions the reticle 26 relative to the assembly 16 and the wafer 28. Somewhat similarly, the wafer stage assembly 20 holds and positions the wafer 28 with respect to the projected image of the illuminated portions of the reticle 26. The stage assemblies 18, 20 are controlled in a manner as discussed above and are configured as described in more detail below.

In photolithography systems, when linear motors (see U.S. Pat. Nos. 5,623,853 and 5,528,118) are used in a reticle-stage assembly 18 and/or in a wafer-stage assembly 20, the linear motors can be either an air-levitation type employing air bearings or a magnetic-levitation type using Lorentz force or reactance force. Additionally, the stage can move along a guide, or it can be a guideless type of stage. As far as is permitted by law, the disclosures in these U.S. patents are incorporated herein by reference.

Alternatively, the reticle stage and/or wafer stage can be driven by a planar motor. A planar motor drives the stage by an electromagnetic force generated by a magnet unit having two-dimensionally arranged magnets and an armature-coil unit having two-dimensionally arranged coils in facing positions. With this type of driving system, either the magnet unit or the armature-coil unit is connected to the stage and the other unit is mounted on the moving-plane side of the stage.

Movement of the stages as described above generates reaction forces that can affect performance of the exposure system. Reaction forces generated by motion of the wafer stage can be mechanically transferred to the floor (ground) by using a frame member as discussed in U.S. Pat. No. 5,528,100. Additionally, reaction forces generated by motion of the reticle stage can be mechanically transferred to the floor (ground) using a frame member as discussed in U.S. Pat. No. 5,874,820. As far as is permitted by law, the disclosures in these U.S. patents are incorporated herein by reference.

Typically, multiple integrated circuits or other micro-devices are produced on a single wafer 28. The process may involve a substantial number of repetitive, identical, or substantially similar movements of portions of the reticle-stage assembly 18 and/or the wafer-stage assembly 20. Each such repetitive movement is also referred to herein as an iteration, iterative movement, or cycle, as defined in greater detail below.

The measurement system 22 monitors movement of the reticle 26 and the wafer 28 relative to the assembly 16 or some other reference. With this information, the control system 24 controls the reticle-stage assembly 18 to precisely position the reticle 26 and the wafer-stage assembly 20 to precisely position the wafer 28 relative to the assembly 16. For example, the measurement system 22 can utilize multiple laser interferometers, encoders, and/or other measuring devices.

One or more sensors 23 can monitor and/or receive information regarding one or more components of the exposure apparatus 10. For example, the exposure apparatus 10 can include one or more sensors 23 positioned on or near the assembly 16, the frame 12, or other suitable components. Information from the sensor(s) 23 can be provided to the control system 24 for processing. In the embodiment illustrated in FIG. 1, the exposure apparatus 10 can include two spaced-apart, separate sensors 23 that are secured to the apparatus frame 12 and two spaced-apart, separate sensors 23 that are secured to the assembly 16. Alternatively, the sensors 23 can be positioned elsewhere. The type of sensor 23 can be varied. For example, one or more of the sensors 23 can be an accelerometer, an interferometer, a gyroscope, and/or other type of sensor.

The control system 24 receives information from the measurement system 22 and other systems and controls the stage assemblies 18, 20 to precisely and synchronously position the reticle 26 and the wafer 28 relative to the assembly 16 or other reference. The control system 24 includes one or more processors, filters, and other circuits for performing its functions, as discussed above.

An exposure apparatus according to the embodiments described herein can be built by assembling various subsystems in such a manner that prescribed mechanical accuracy, electrical accuracy, and optical accuracy are maintained. To maintain the various accuracies, prior to and following assembly, every optical system is adjusted to achieve its specified optical accuracy. Similarly, every mechanical system and every electrical system are adjusted to achieve their respective specified mechanical and electrical accuracies. The process of assembling each subsystem into an exposure system includes mechanical interfaces, electrical-circuit wiring connections, and air-pressure plumbing connections between each subsystem, as required. Also, each subsystem is typically assembled prior to assembling an exposure apparatus from the various subsystems. After assembly of an exposure apparatus from its various subsystems, a total adjustment is performed to make sure that accuracy and precision are maintained in the exposure apparatus. It is desirable to manufacture an exposure apparatus in a clean room in which temperature and cleanliness are controlled.

Fabrication of Microelectronic Devices

Figure 22:
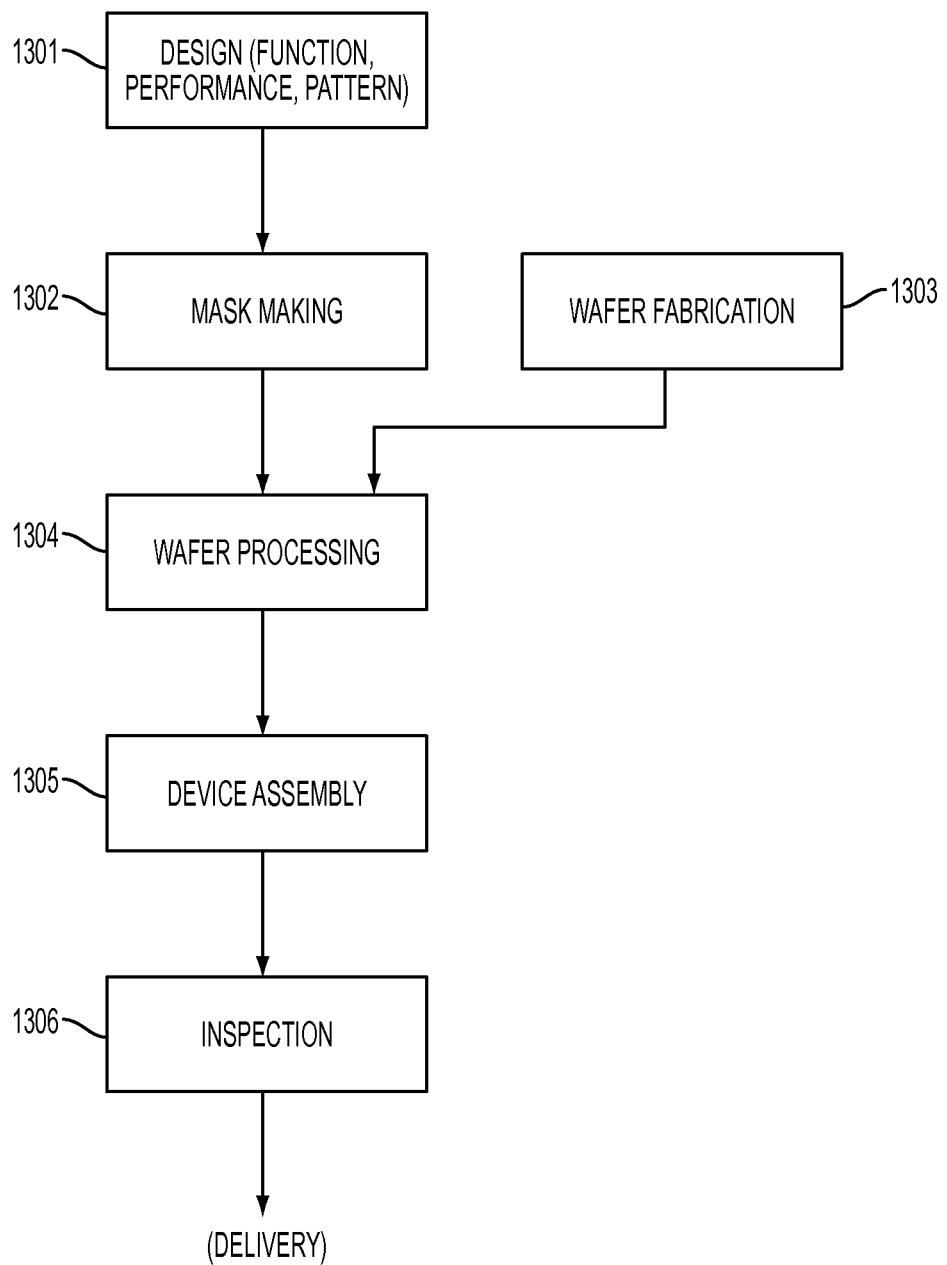
FIG. 22 is a process flow diagram of steps of an embodiment of a method for fabricating a semiconductor device (as an exemplary microelectronic device).
Figure 23:
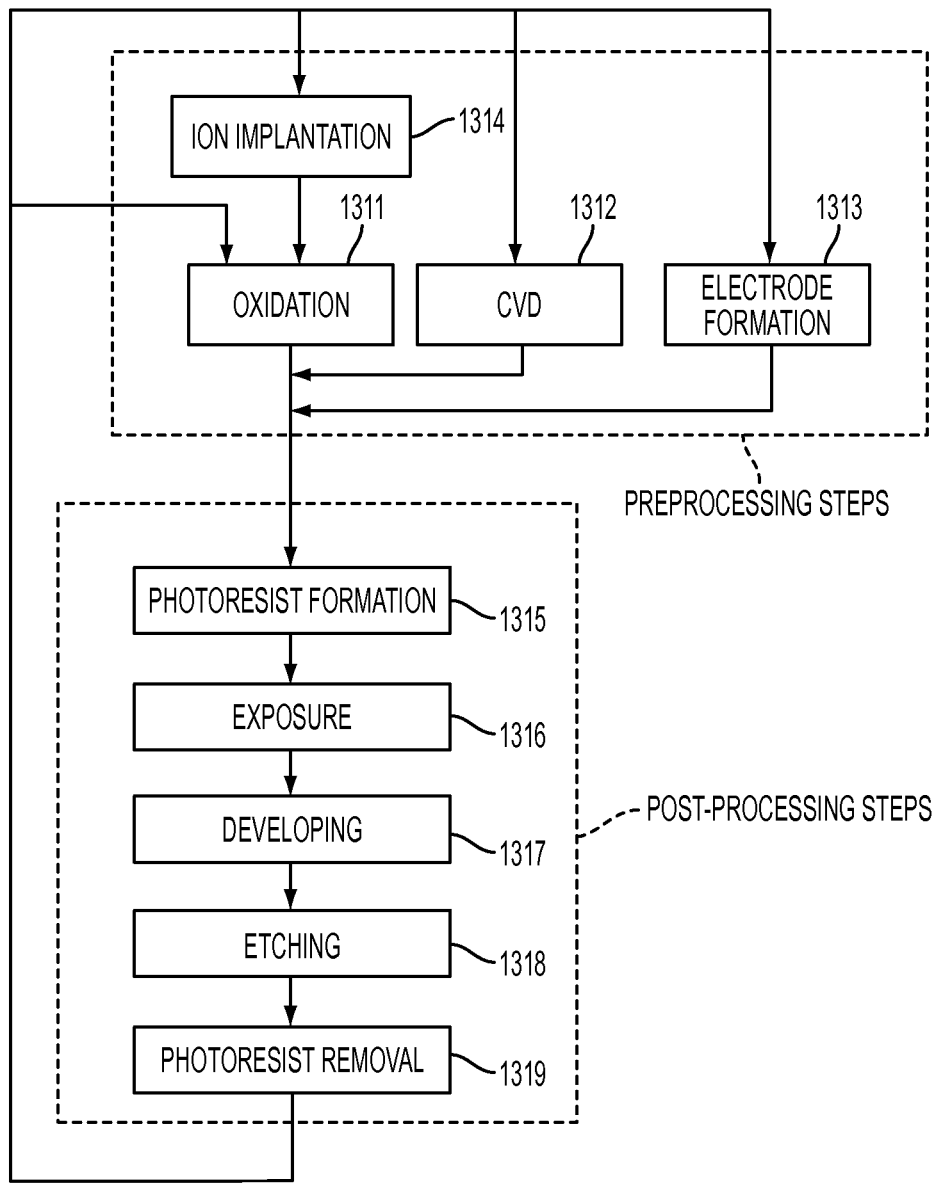
FIG. 23 is a process flow diagram of steps of an embodiment of a method for processing a wafer, i.e., step 1304 of FIG. 22.

Microelectronic devices (such as, but not limited to, semiconductor devices) may be fabricated using the apparatus described above. An exemplary fabrication process is shown in FIG. 22. The process begins at step 1301 in which the function and performance characteristics of microelectronic device are designed or otherwise determined. Next, in step 1302, a reticle (mask) in which has a pattern is defined based upon the design of the microelectronic device. In a parallel step 1303, a wafer or other substrate is made from a silicon material, for example. In step 1304 the reticle pattern defined in step 1302 is exposed onto the wafer fabricated in step 1303 using an exposure apparatus that includes a coarse reticle-scanning stage and a fine reticle-scanning stage that moves with the coarse reticle-scanning stage. An exemplary process for exposing a reticle (mask) pattern onto a wafer is shown in FIG. 23, discussed below. In step 1305 the microelectronic device is assembled. The assembly of the device generally includes, but is not limited to, wafer-dicing processes, bonding processes, and packaging processes. Finally, the completed device is inspected in step 1306.

FIG. 23 is a process-flow diagram of the steps associated with wafer processing in the case of fabricating semiconductor devices in accordance with an embodiment. In step 1311, the surface of a wafer is oxidized. Then, in step 1312, which is a chemical vapor deposition (CVD) step, an insulative film is formed on the wafer surface. After the insulative film is formed, in step 1313 electrodes are formed on the wafer by vapor deposition. Then, in step 1314 ions are implanted in the wafer using substantially any suitable technique. Steps 1311-1314 are generally termed pre-processing steps for wafers during wafer processing. It will be understood that selections made in each step, e.g., the concentration of various chemicals to use in forming the insulative film in step 1312, may be made based upon processing requirements.

Upon completion of pre-processing steps, post-processing steps may be implemented. In step 1315 a layer of photoresist is applied to the wafer. Then, in step 1316, an exposure apparatus is used to transfer the circuit pattern defined on the reticle to the wafer. Transferring the circuit pattern of the reticle to the wafer generally includes executing a scanning motion of a reticle-scanning stage. In one embodiment, scanning the reticle-scanning stage includes accelerating a fine stage with a coarse stage, then accelerating the fine stage substantially independently from the coarse stage.

After transfer of the circuit pattern on the reticle to the wafer, the exposed wafer is developed in step 1317. After development of the wafer, parts thereof other than residual photoresist, e.g., the exposed material surface, may be removed by etching. Finally, in step 1319, unnecessary photoresist remaining after etching is removed. Multiple circuit patterns may be formed on the wafer by repeating the pre-processing and post-processing steps.

While the invention has been described above in connection with representative embodiments and examples, it will be understood that the invention is not limited to those embodiments and/or examples. On the contrary, it is intended to encompass all modifications, alternatives, and equivalents as may be included within the spirit and scope of the invention as defined by the appended claims.

What is claimed is:

1. A stage assembly, comprising:
   a first stage; and
   a control system coupled to the first stage;
   the control system comprising a first controller coupled to control the first stage in a feedback-control manner, based on output data of first-stage position, and a second controller coupled to control the first stage in a feed-forward-control manner, based on output data of first-stage position;
   the first and second controllers being programmed to perform iterative feedback tuning (IFT), based on first-stage position measurements obtained with respective iterations of first-stage motion.

2. The assembly of claim 1, wherein:
   the second controller is coupled to receive data including a trajectory of the first stage; and
   the first controller is coupled to receive data including a following-error of the first stage.

3. The assembly of claim 1, further comprising:
   a second stage; and
   a third controller coupled to receive data regarding at least respective position errors of the first and second stages and programmed to synchronize movement of the first and second stages, according to at least one respective parameter vector.

4. The assembly of claim 3, wherein the third controller is further programmed to perform IFT, cooperatively with the first and second controller.

5. The assembly of claim 4, wherein the third controller is operable to minimize a respective cost-function that includes:
   a synchronization error in motion of at least one of the first and second stages relative to the other; and
   a control output of the first controller, the control output being a function of the at least one respective parameter vector of each of the first, second, and third controllers.

6. The assembly of claim 5, wherein the synchronization error is a function of the at least one respective parameter vector from each of the first, second, and third controllers.

7. The assembly of claim 6, wherein the synchronization error and the control output each have a respective weighting function in the cost-function.

8. The assembly of claim 3, wherein an output of the third controller is input to the first controller.

9. The assembly of claim 3, wherein an output of the second controller is summed with an output of the first controller.

10. The assembly of claim 3, wherein an output of the third controller is connected such that a difference of a trajectory of the first stage and the output of the third controller is input to the first controller.

11. The assembly of claim 10, wherein the input to the first controller is a following-error that is a function of the at least one respective parameter vector of each of the first, second, and third controllers.

12. The assembly of claim 3, wherein each iteration of IFT performed by the controllers includes:
   a first experiment directed to an evaluation of the cost-function; and
   respective experiments directed to measurements of gradients of the at least one respective parameter vector of each of the first, second, and third controllers.

13. The assembly of claim 1, wherein the IFT performed by the first and second controllers includes minimization of a cost function, the cost function including a following-error of the first stage and a control output of the first controller, the control output being a function of at least one respective parameter vector of each of the first and second controllers.

14. The assembly of claim 13, wherein the following-error and the control output each have a respective weighting function in the cost-function.

15. The assembly of claim 1, wherein the first stage comprises a reticle stage or a wafer stage.

16. The assembly of claim 3, wherein:
   the first stage comprises a reticle stage; and
   the second stage comprises a wafer stage.

17. A precision system, comprising:
   a process assembly;
   a first stage that is movable relative to the process assembly; and
   a control system coupled to the first stage, the control system comprising a first controller coupled to control the first stage in a feedback-control manner, according to at least one respective parameter vector based on first-stage position, and a second controller coupled to control the first stage in a feed-forward-control manner, according to at least one respective parameter vector based on first-stage position; and
   the first and second controllers being programmed to perform iterative feedback tuning (IFT), based on first-stage position measurements obtained with respective iterations of first-stage motion.

18. The system of claim 17, further comprising:
   a second stage that is movable relative to the process assembly; and
   a third controller coupled to receive data at least regarding respective position errors of the first and second stages and to control synchronous movement of the first and second stages, according to a respective transfer-function of at least one respective parameter vector of the third controller.

19. The system of claim 18, wherein the third controller is programmed to perform IFT, in cooperation with the first and second controller.

20. The system of claim 18, wherein:
   the process assembly comprises an exposure-optical system;
   the first stage comprises a reticle stage; and
   the second stage comprises a wafer stage.

21. The system of claim 18, wherein:
   the process assembly comprises an exposure-optical system; and
   the first stage comprises a reticle stage or a wafer stage.

* * * * *